(12) United States Patent
Kakegawa

(10) Patent No.: US 7,964,935 B2
(45) Date of Patent: Jun. 21, 2011

(54) PHASE CHANGE RANDOM ACCESS MEMORY AND SEMICONDUCTOR DEVICE

(75) Inventor: Tomoyasu Kakegawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 514 days.

(21) Appl. No.: 12/219,367

(22) Filed: Jul. 21, 2008

(65) Prior Publication Data
US 2009/0026435 A1 Jan. 29, 2009

(30) Foreign Application Priority Data

Jul. 25, 2007 (JP) ............................. P2007-193560

(51) Int. Cl.
*H01L 29/00* (2006.01)
(52) U.S. Cl. ................ 257/529; 257/537; 257/E23.149; 257/E21.592
(58) Field of Classification Search .................. 257/529, 257/537, E23.147, E23.149, E21.592
See application file for complete search history.

(56) References Cited

U.S. PATENT DOCUMENTS

| | | | | |
|---|---|---|---|---|
| 7,589,364 B2 * | 9/2009 | Asano et al. | .................. | 257/246 |
| 7,635,855 B2 * | 12/2009 | Chen et al. | ........................ | 257/4 |
| 2008/0001137 A1 * | 1/2008 | Kozicki et al. | .................... | 257/4 |
| 2008/0173975 A1 * | 7/2008 | Chen et al. | .................... | 257/529 |
| 2008/0272360 A1 * | 11/2008 | Kozicki | ........................... | 257/4 |

FOREIGN PATENT DOCUMENTS

| | | |
|---|---|---|
| JP | 2003-163280 | 6/2003 |
| JP | 2006-165560 | 6/2006 |
| JP | 2007-73779 | 3/2007 |

* cited by examiner

*Primary Examiner* — Ngan Ngo
(74) *Attorney, Agent, or Firm* — McGinn IP Law Group, PLLC

(57) ABSTRACT

A phase change random access memory comprises an under electrode; an interlayer insulating layer which is formed on the under electrode; an impurity diffusion layer which is embedded into a pore through the interlayer insulating layer; a phase change recording layer which is formed on the interlayer insulating layer; an upper electrode which is formed on the phase change recording layer; a side gate electrode which is located on an inner wall of the pore into which the impurity diffusion layer is embedded; and a side gate insulating layer which is located between the side gate electrode and the impurity diffusion layer, wherein the side gate electrode applies an electric field to the impurity diffusion layer via the side gate insulating lay, the impurity diffusion layer is depleted, and so that an effective diameter of the impurity diffusion layer can become smaller than the pore diameter.

10 Claims, 30 Drawing Sheets

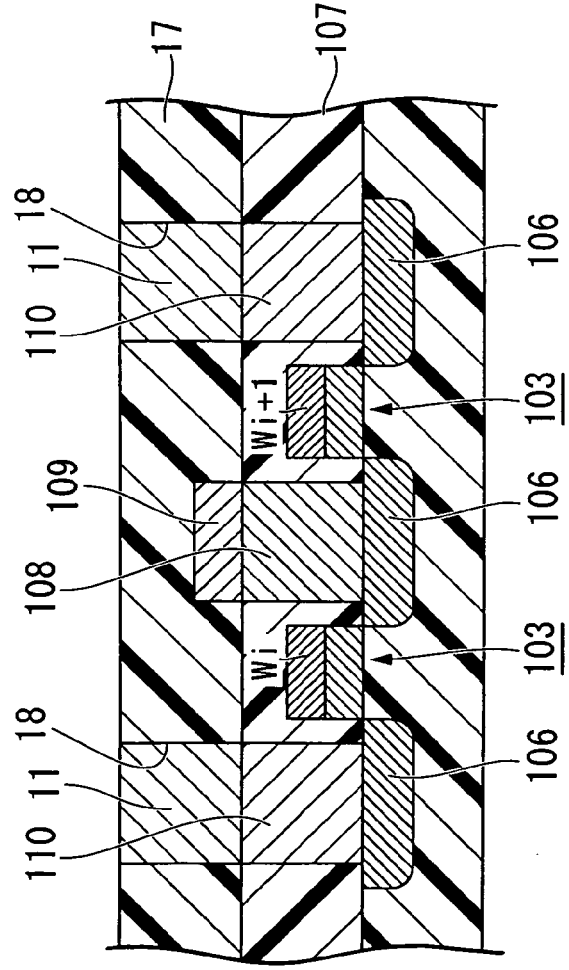

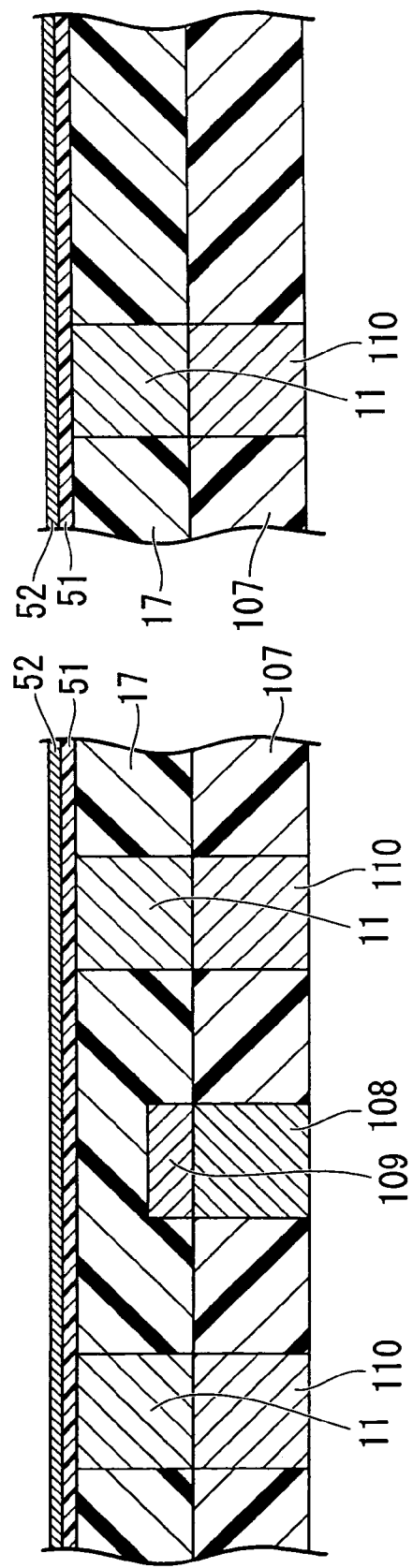

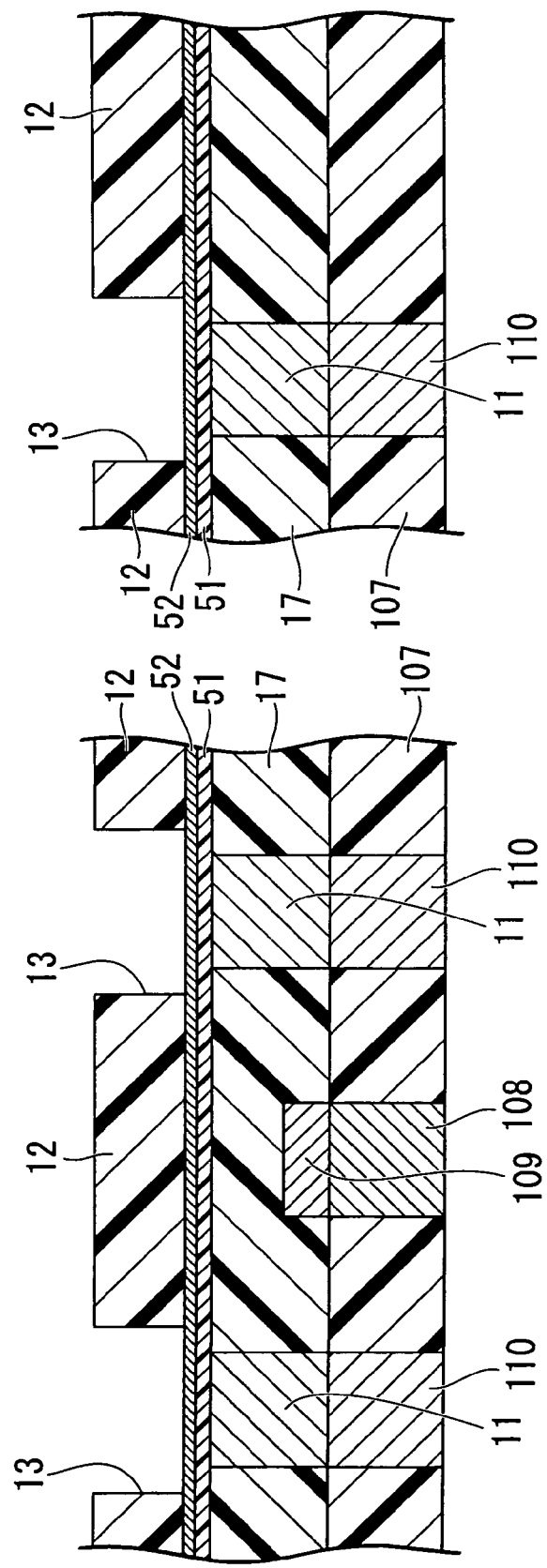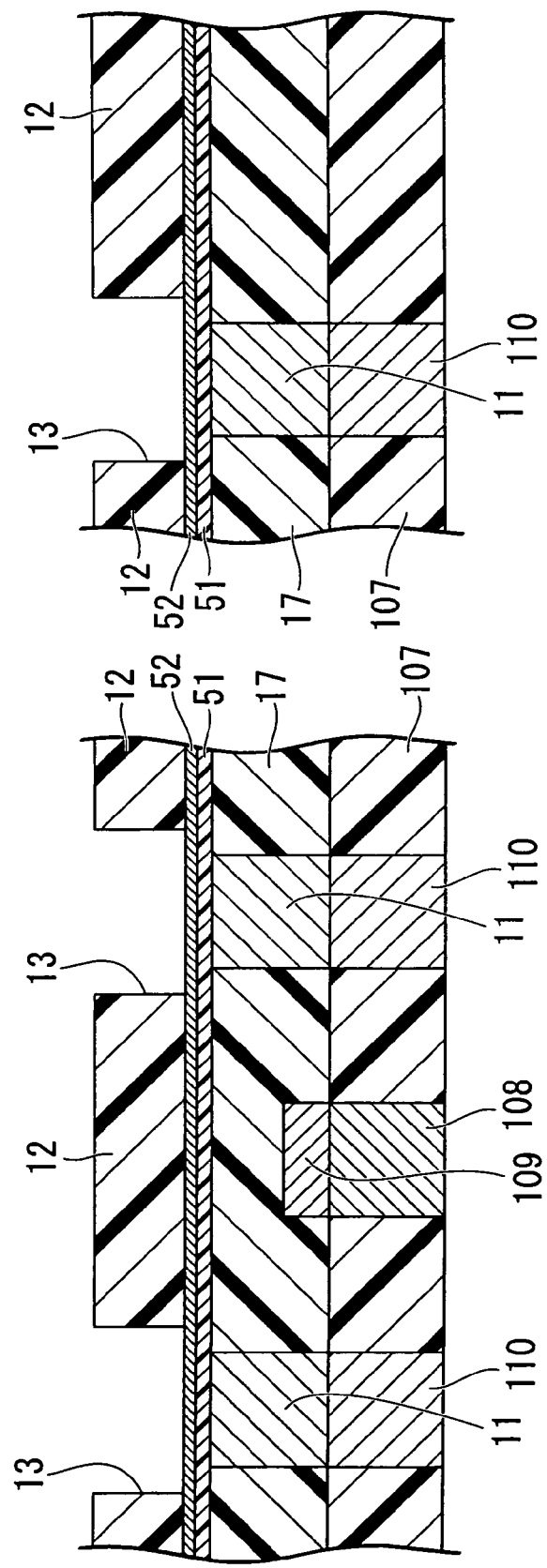

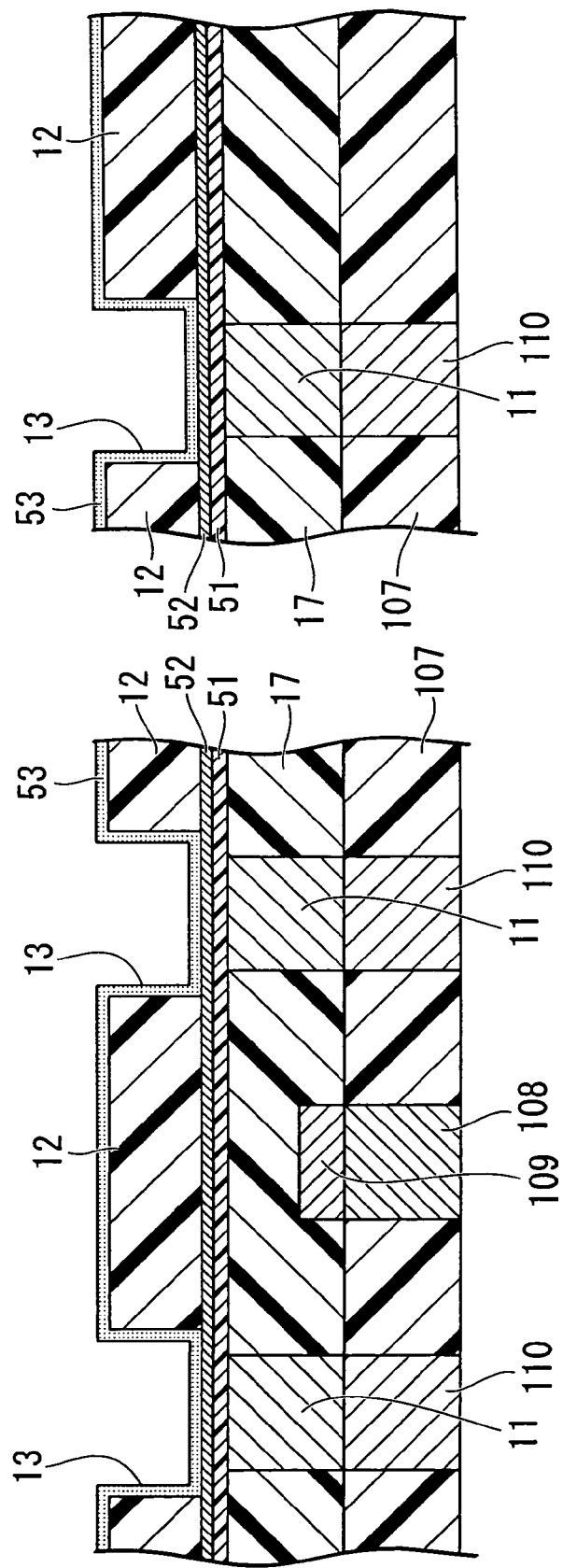

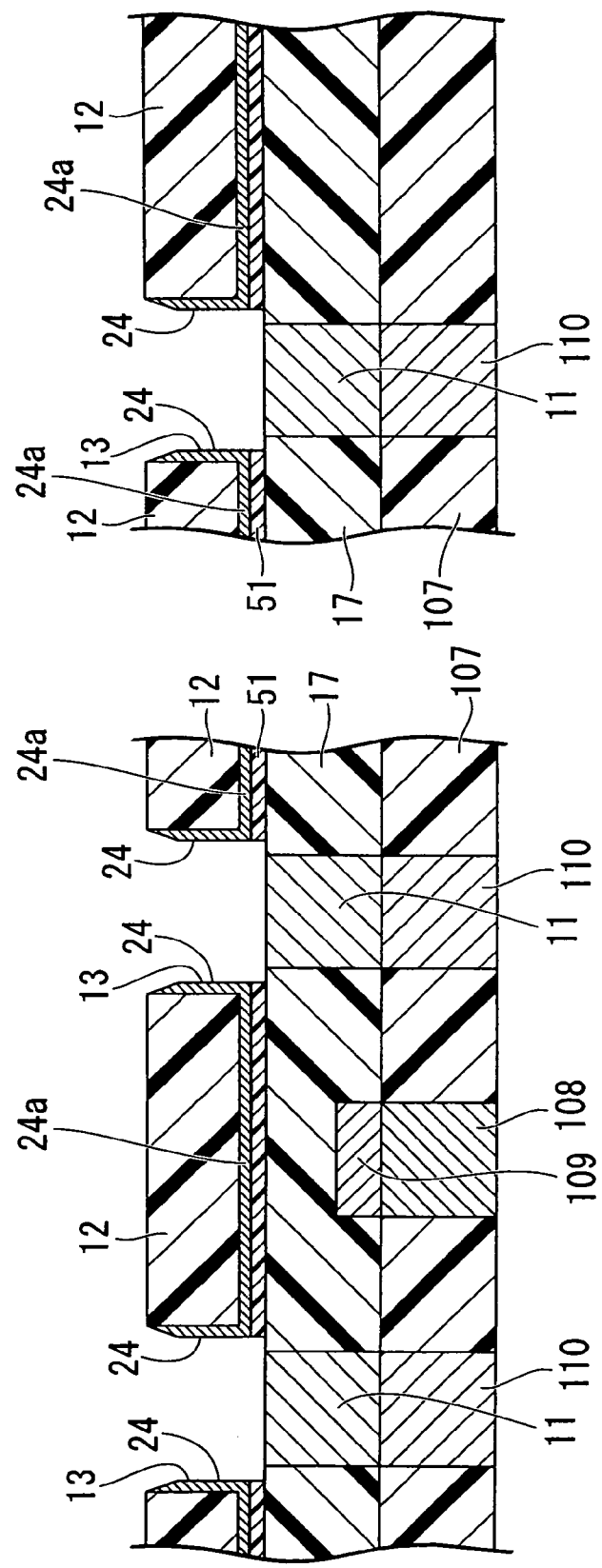

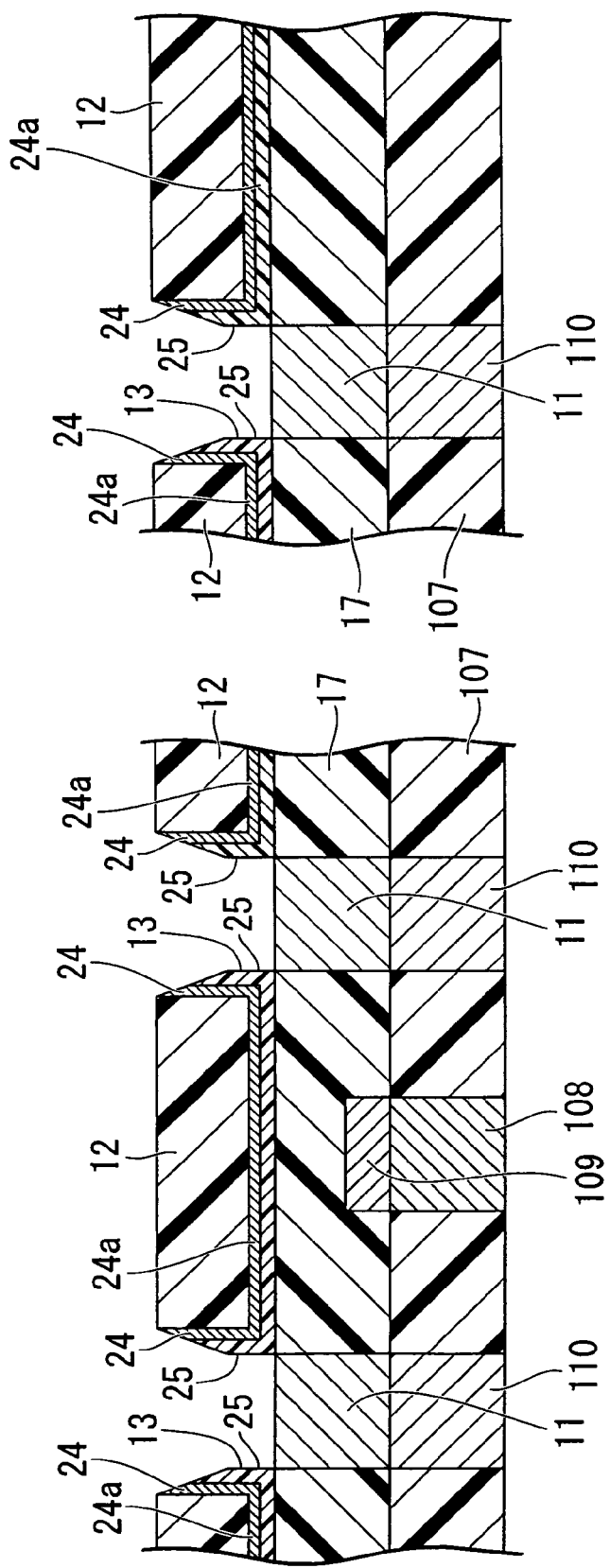

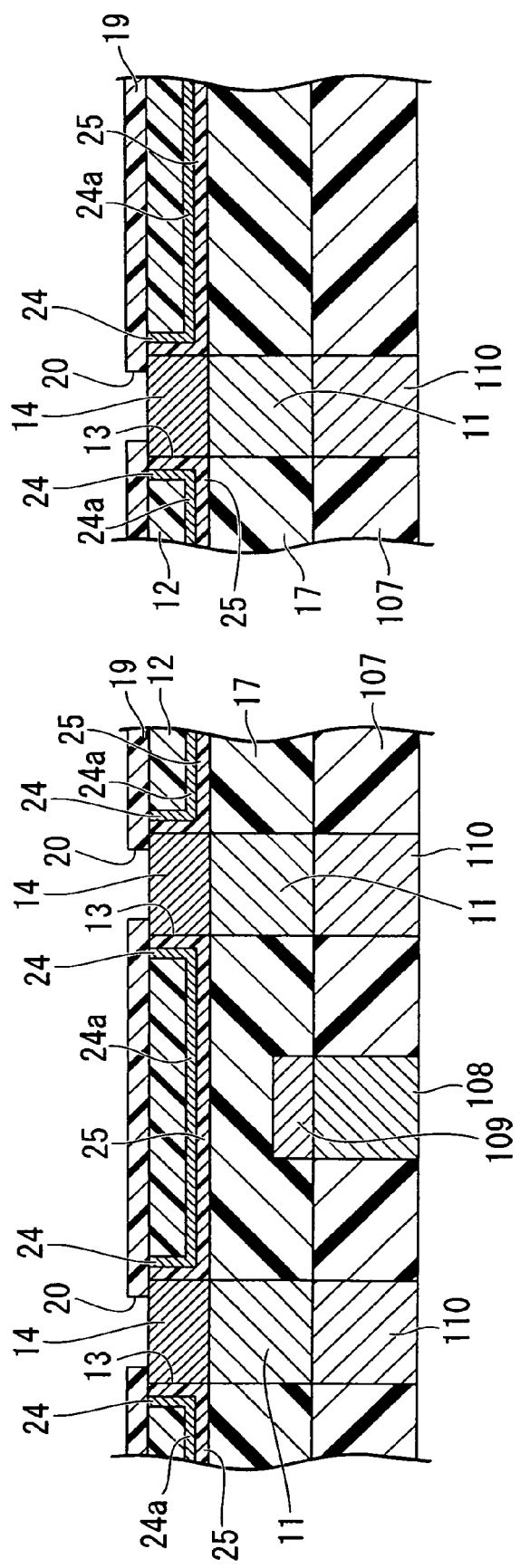

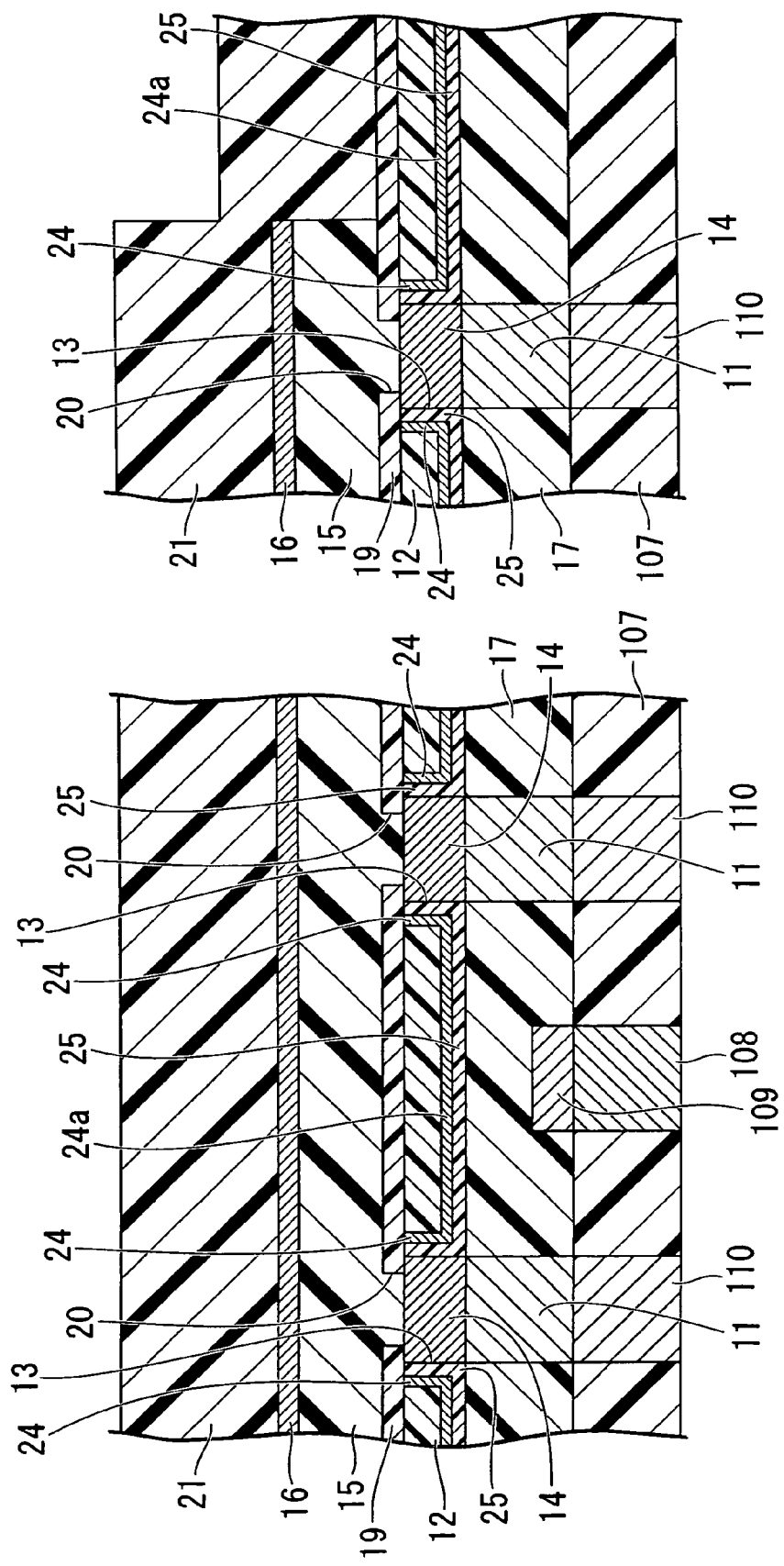

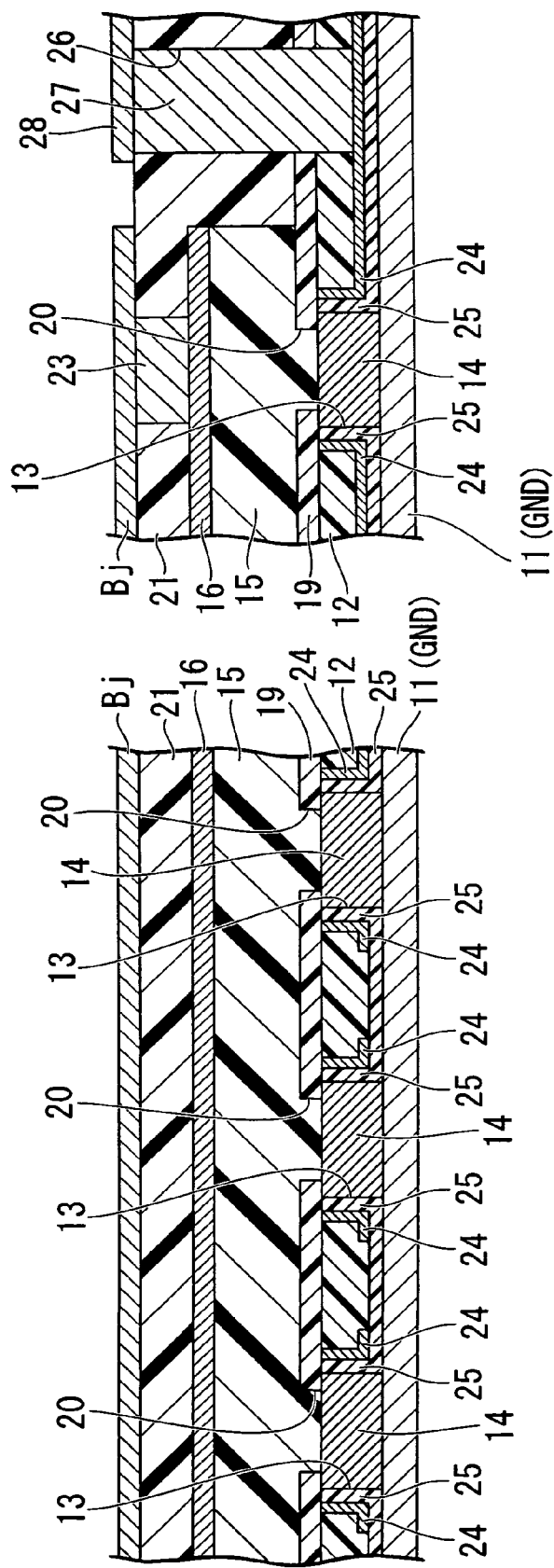

PHASE CHANGE RANDOM ACCESS MEMORY AND SEMICONDUCTOR DEVICE

BACKGROUND OF THE INVENTION

1. Field of the Invention

The present invention relates to a phase change type nonvolatile memory (hereinbelow referred to as a PRAM: phase change random access memory) and a semiconductor device.

Priority is claimed on Japanese Patent Application No. 2007-193560, filed Jul. 25, 2007, the content of which is incorporated herein by reference.

2. Description of Related Art

There is a variety of memory devices which are constituted hierarchically, used in a personal computer, a server and the like. The memory device which is assigned to a lower hierarchy is required to be cheap and have mass storage capacity, while the memory device which is assigned to a higher hierarchy is required to have high access speed. Magnetic storages such as a hard disk drive and a magnetic tape are generally used in the memory devices which are assigned to the lowest hierarchy. The magnetic storage is nonvolatile and able to have a much larger data capacity than a semiconductor memory, with a low cost. However, the access speed of the magnetic storage is slow and the magnetic storage does not possess random accessness in many cases. For this reason, a program, data which is stored for a long term, and the like are stored in the magnetic storage so as they are transferred to the memory device, to order, which is assigned to the higher hierarchy.

A main memory is the memory device which is assigned to the higher hierarchy than the magnetic storage. In general, a dynamic random access memory (DRAM) is used as the main memory. The DRAM enables to high speed access when compared with the magnetic storage, and has random accessness. Furthermore, the DRAM has a character that has a lower cost per bit than that of high speed semiconductor memories such as a static random access memory (SRAM) and the like.

An integrated cache memory which is integrated in a micro processing unit (MPU) is assigned to the highest hierarchy. Since the integrated cache memory is connected with a core of the MPU via an inner bus, the integrated cache memory provides significantly higher access speed. However, the capacity of the integrated cache memory is quite small. A second cache, a third cache and the like might be used as the memory device that constitutes the hierarchy between the integrated cache memory and the main memory.

The reason that the DRAM is selected as the main memory is a significant good balance of the access speed and the cost per bit. Moreover, the DRAM provides the mass storage capacity among the semiconductor memories. Recently a DRAM chip having a capacity over 1 Gbit has been developed. However, since the DRAM is volatile, the stored data is deleted when a power supply unit turns off. For this reason, the DRAM is inadequate to store the program and the data which is stored for the long term. When the power supply is turned on, a refresh operation is regularly required to maintain the data. Therefore, a reduction in the power consumption is limited, and there is a necessity of complex control by a controller.

A flash memory is known as the volatile semiconductor memory having mass storage capacity. However, the flash memory needs to load a high current for writing and deleting the data. Moreover, the flash memory has a demerit for which writing time and deleting time are quite long. Therefore, it is inadequate to substitute the flash memory for the DRAM as the main memory. Although, in regard to the nonvolatile memories, a magnetoresistive random access memory (MRAM), a ferroelectric random access memory (FRAM) and the like are proposed, it is difficult to obtain a comparable storage capacity to the DRAM.

On the other hand, the PRAM that records in phase change materials is proposed as the semiconductor memory instead of the DRAM (for example, refer to Japanese Unexamined Patent Applications No. 2006-165560, No. 2007-73779, and No. 2003-163280). The PRAM stores the data by using a phase state of the phase change materials which are included in a recording layer. That is, since an electrical resistance of the phase change materials is significantly different according as the phase change materials assume a crystalline phase or an amorphous phase, the PRAM enables recording of the data by using this electrical resistance difference.

The phase state change is induced by heating the phase change materials through a writing current application. The data reading in which the value of the reading current, or measuring current, is set to be enough lower than the writing current to be able to protect the phase state change, is performed by measuring the electrical resistance of the phase change materials. Therefore, the phase state of the phase change materials is unchanged unless a high temperature is applied so the data is maintained even if the power supply is turned off.

In order to heat the phase change materials effectively through the writing current, it is useful to narrow a current pass as small as possible by focusing a heat region (heat spot) on the recording layer.

As set forth, in the PRAM, the phase change materials change the phase state from the crystalline phase to the amorphous phase, and vice versa, by use of the heat that is generated at a contact interface between a heat plug and the recording layer when the current is applied to the heat plug. The current which is necessary for the phase change process from the crystalline phase to the amorphous phase is called "Ireset".

In the conventional PRAM, as shown in FIG. 33, a heat plug 201 is embedded into a pore 203 passing through an interlayer insulating layer 202. A recording layer 204 which is formed on the interlayer insulating layer 202 is heated by the heat plug 201 with a diameter of the pore 203. In this case, a contact diameter $\phi'$ between the heat plug 201 and the recording layer 204 is limited to around 100 to 160 nm, due to a process limit of the pore 203 by using a lithographical technology. Since the lower limit of Ireset depends on a contact area $\pi \times (\phi'/2)^2$ between the heat plug 201 and the recording layer 204, the Ireset is inapplicable smaller than that at the process limit of the pore 203.

For this reason, it is proposed for the PRAM, as shown in FIG. 34, that a sidewall 205 is provided on an inner wall of the pore 203 so as the contact diameter $\phi'$ between the heat plug 201 and the recording layer 204 further decreases. In this case, however, there is a limit of decreasing the contact diameter $\phi'$ between the heat plug 201 and the recording layer 204. In the case of the sidewall 205 being thicker, since a microloading effect becomes predominant, an etch-back becomes difficult when the sidewall 205 is formed. In this case, due to productive failures such as an incomplete etching and the like, the process limit of $\phi'$ has been considered around 30 nm so far.

In order to further increase the capacity of the PRAM, the Ireset should be decreased by decreasing the contact diameter $\phi'$ between the heat plug 201 and the recording layer 204. However, in the conventional PRAM, since decreasing the contact diameter $\phi'$ between the heat plug 201 and the recording layer 204 is restricted by the process limit of the pore 203 and the sidewall 205, the Ireset is inapplicable smaller than that at the process limit. The heat plug 201 is generally composed of metals having a high thermal conductivity. If a heat-sink effect of the heat plug 201 becomes predominant, the Ireset should be further larger. Therefore, in order to heat the phase change materials (change the phase state) by the much smaller Ireset, it is necessary to narrow a current pass as small as possible by focusing the heat region (heat spot) on the recording layer.

SUMMARY

The present invention seeks to solve one or more of the above problems, or to improve those problems at least in part.

The present invention provides a phase change random access memory that can attempt to decrease the Ireset beyond the process limit.

The present invention provides a semiconductor device that can arbitrary control an effective value of the current that passes through an impurity diffusion layer.

In one embodiment, there is provided a phase change random access memory that comprises: an under electrode; a first interlayer insulating layer which is formed on the under electrode; an impurity diffusion layer which is embedded into a first pore passing through the first interlayer insulating layer; a phase change recording layer which is formed on the first interlayer insulating layer; an upper electrode which is formed on the phase change recording layer; and an electric field application portion that applies an electric field to the impurity diffusion layer so as to deplete at least a portion of the impurity diffusion layer and decrease an effective diameter of the impurity diffusion layer, wherein an effective diameter of a heat spot that changes a phase state of the phase change recording layer becomes smaller than the diameter of the first pore by applying a current between the under electrode and the upper electrode.

In the embodiment of the phase change random access memory, the electric field application portion may further comprise: a side gate electrode which is located on an inner wall of the first pore; and a side gate insulating layer which is located between the side gate electrode and the impurity diffusion layer.

In the embodiment of the phase change random access memory, the side gate electrode may be provided on a partial or entire surface of the inner wall of the first pore.

In the embodiment of the phase change random access memory, the side gate electrode may be provided and elongated along the depth direction on the inner wall of the first pore.

The embodiment of the phase change random access memory may further comprise: a second interlayer insulating layer which is provided between the first interlayer insulating layer and the phase change recording layer; and a second pore which is provided on said second interlayer insulating layer at a position above said first pore, said second pore being embedded with a portion of said phase change recording layer, a diameter of said second pore being smaller than that of said first pore.

In the embodiment of the phase change random access memory, a portion of the phase change recording layer may be embedded into the first pore.

In the embodiment of the phase change random access memory, a sidewall layer may be provided on the inner wall of the first pore.

In one embodiment, there is provided a semiconductor device that comprise: an under electrode; an interlayer insulating layer which is formed on the under electrode; an impurity diffusion layer which is embedded into a pore passing through the interlayer insulating layer; an upper electrode which is formed on the interlayer insulating layer; and an electric field application portion that applies an electric field to the impurity diffusion layer so as to deplete at least a portion or the whole of the impurity diffusion layer and to change an effective value of a current that passes through the impurity diffusion layer when a current is applied between the under electrode and the upper electrode.

The embodiment of the semiconductor device may further comprise a resistance change layer which is provided between the impurity diffusion layer and the upper electrode, wherein the current is applied between the under electrode and the upper electrode until an electrical resistance of the resistance change layer changes so as maintain the changed electrical resistance of the resistance change layer after the current is ceased.

The embodiment of the semiconductor device may further comprise an insulating thin layer which is provided between the impurity diffusion layer and the upper electrode, wherein a break down current is applied between the under electrode and the upper electrode so that an insulative state between the impurity diffusion layer and the upper electrode caused by the insulating thin layer switch to a conductive state.

BRIEF DESCRIPTION OF THE DRAWINGS

The above features and advantages of the present invention will be more apparent from the following description of certain preferred embodiments taken in conjunction with the accompanying drawings, in which:

FIG. 7A and FIG. 7B are cross-sectional views that show a production process of a PRAM in sequence at the inner position X and the outer position Y, respectively, of the memory cell array shown in FIG. 5;

FIG. 8A and FIG. 8B are cross-sectional views that show a production process of a PRAM in sequence at the inner position X and the outer position Y, respectively, of the memory cell array shown in FIG. 5;

FIG. 9A and FIG. 9B are cross-sectional views that show a production process of a PRAM in sequence at the inner position X and the outer position Y, respectively, of the memory cell array shown in FIG. 5;

FIG. 10A and FIG. 10B are cross-sectional views that show a production process of a PRAM in sequence at the inner position X and the outer position Y, respectively, of the memory cell array shown in FIG. 5;

FIG. 11A and FIG. 11B are cross-sectional views that show a production process of a PRAM in sequence at the inner position X and the outer position Y, respectively, of the memory cell array shown in FIG. 5;

FIG. 13A and FIG. 13B are cross-sectional views that show a production process of a PRAM in sequence at the inner position X and the outer position Y, respectively, of the memory cell array shown in FIG. 5;

FIG. 17A and FIG. 17B are cross-sectional views that show a production process of a PRAM in sequence at the inner position X and the outer position Y, respectively, of the memory cell array shown in FIG. 5;

FIG. 19A and FIG. 19B are cross-sectional views that show a production process of a PRAM in sequence at the inner position X and the outer position Y, respectively, of the memory cell array shown in FIG. 5;

FIG. 26A and FIG. 26B are cross-sectional views that show the nonvolatile memory devices at the inner position X and the outer position Y, respectively, of the memory cell array shown in FIG. 25;

DETAILED DESCRIPTION OF PREFERRED EMBODIMENTS

Figure 1:
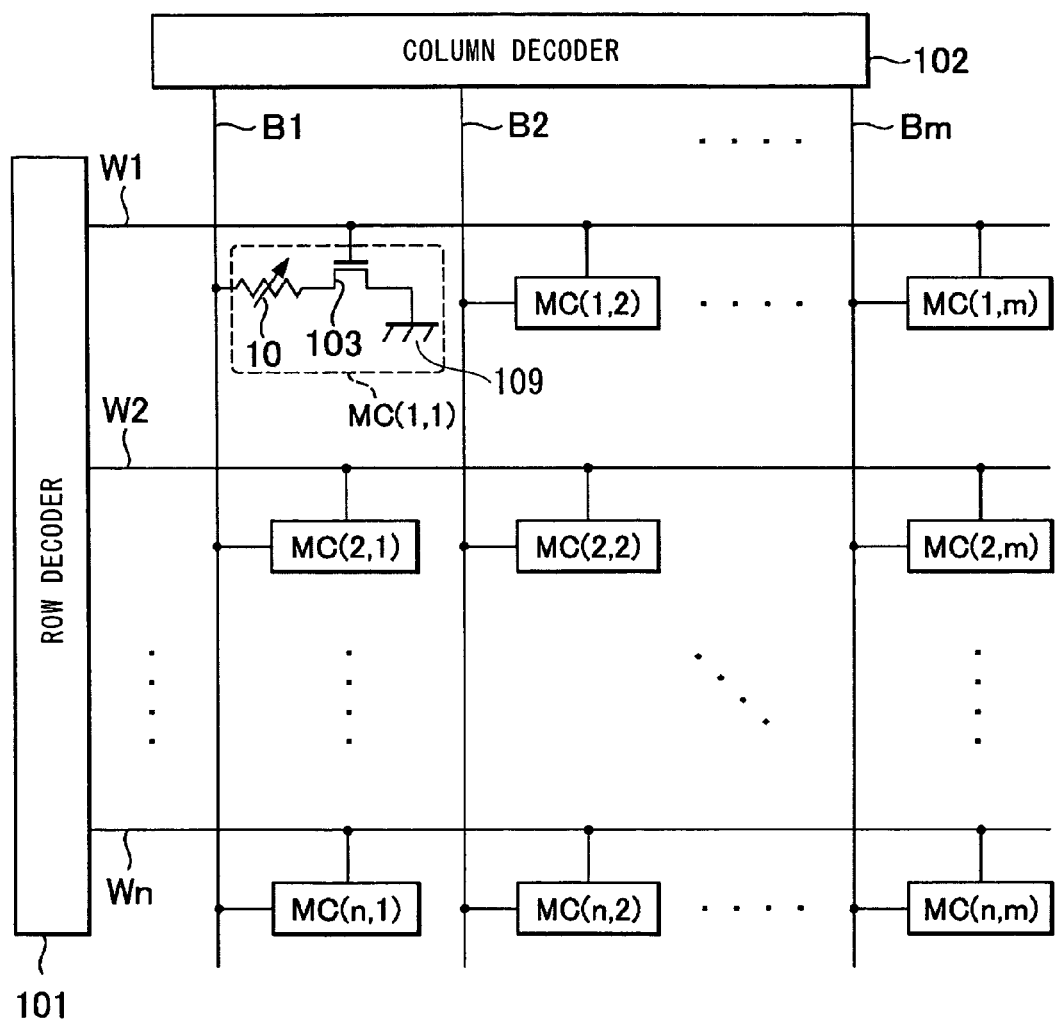
FIG. 1 is a circuit diagram that shows a configuration example of PRAM having an n-row x m-column matrix constitution.

The invention will be described herein with reference to illustrative embodiments. Those skilled in the art will recognize that many alternative embodiments can be accomplished using the teachings of the present invention and that the invention is not limited to the embodiments illustrated here for explanatory purposes.

For the sake of understanding a feature of the embodiments easily, there is a case that magnifies an important part for a convenience in the drawings. Therefore, each component is not always shown at scale in accord with an actual case.

(PRAM and its Manufacture Method)

FIG. 1 is a circuit diagram that shows a memory cell array of the PRAM having an n-row x m-column matrix constitution. As shown in FIG. 1, the PRAM comprises word lines with n-number W1 through Wn, bit lines with m-number B1 through Bm, and memory cells MC (1, 1) through MC (n, m) which are arranged at respective intersections thereof. While the word lines W1 through Wn are connected with a row decoder 101, the bit lines B1 through Bm are connected with a column decoder 102. The memory cell MC each comprises a transistor 103 which is connected serially between the corresponding bit line among B1 through Bm and a ground 109, and a nonvolatile memory device 10. Each control terminal (gate electrode) of transistor 103 is connected with the corresponding word line among W1 through Wn.

Figure 2:
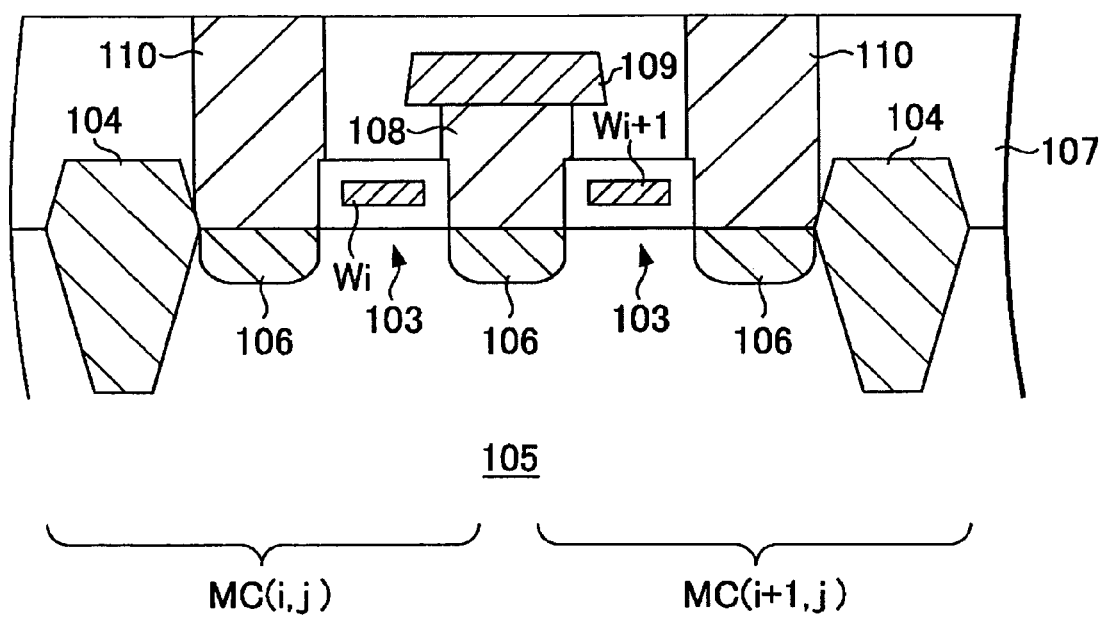
FIG. 2 is a cross-sectional view that shows an example of the transistor comprising the memory cell shown in FIG. 1.

FIG. 2 is a cross-sectional view that shows an example of the transistor that comprises the memory cell MC. There are, in FIG. 2, two memory cells MC (i, j) and MC (i+1, j) that share the corresponding bit line among B1 through Bm. As shown in FIG. 2, the two transistors 103 are located in each activation region 105 which is comparted by a device isolation region 104 and provided with three diffusion regions 106. These two transistors 103 are metal insulator semiconductor field effect transistors (MIS-FETs). The gates of the two transistors 103 are connected with the word lines Wi and Wi+1, respectively. On the other hand, a common source of the two transistors 103 is connected with the ground line 109 via a contact plug 108 which is provided in an interlayer insulating layer 107. Drains of the two transistors 103 are connected with the corresponding nonvolatile memory devices 10 (unillustrated in FIG. 2) via respective contact plugs 110.

Figure 3A:
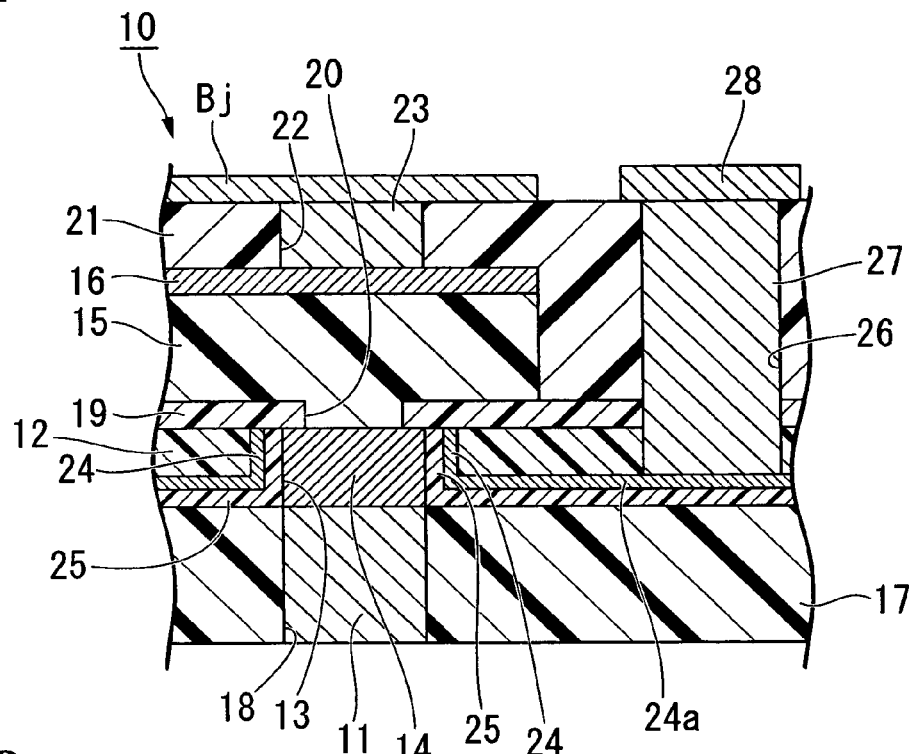
FIG. 3A and FIG. 3B are cross-sectional views that show examples of the nonvolatile memory device comprising the memory cell shown in FIG. 1, in which FIG. 3A and FIG. 3B correspond to situations before and under an electric field application to an impurity diffusion layer.
Figure 3B:
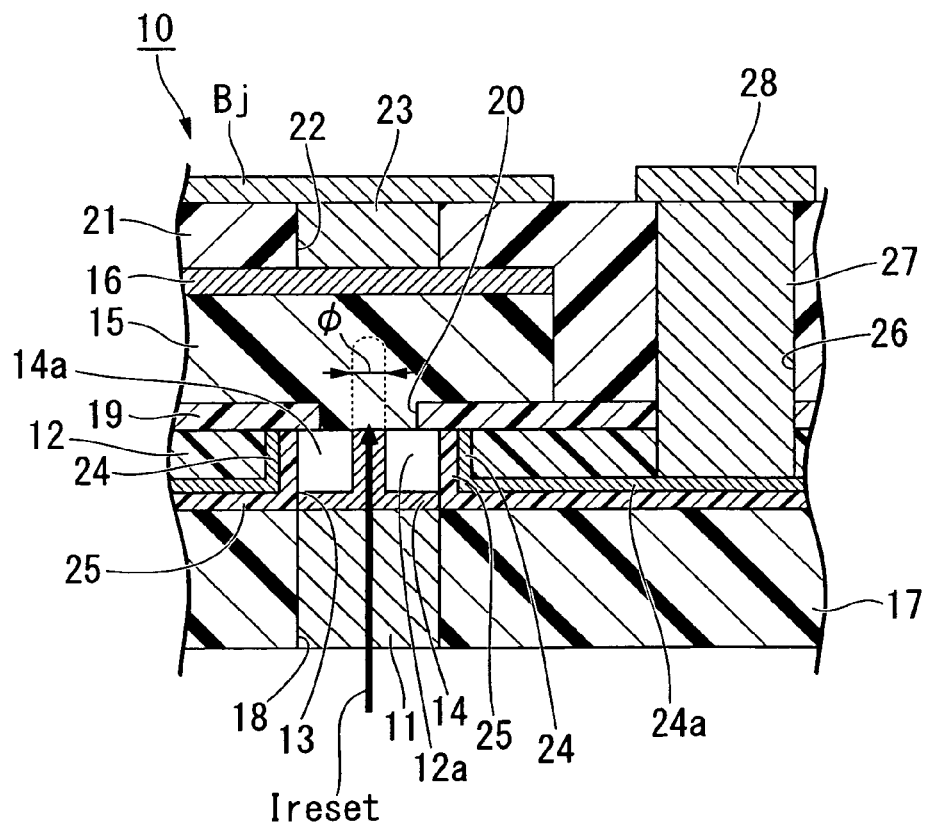

FIG. 3A and FIG. 3B are cross-sectional views that show examples of the nonvolatile memory device 10 comprising the memory cell.

The nonvolatile memory device 10 comprises, as shown in FIG. 3A, an under electrode 11, an interlayer insulating layer 12 which is formed on the under electrode 11, an impurity diffusion layer 14 which is embedded into a pore 13 passing through the interlayer insulating layer 12, a phase change recording layer 15 which is formed on the interlayer insulating layer 12, an upper electrode 16 which is formed on the phase change recording layer 15.

The nonvolatile memory device 10 further comprises an interlayer insulating layer 17 which covers a surface of the contact plug 110, and a pore 18 which passes through the interlayer insulating layer 17, just on the contact plug 110. The under electrode 11 is embedded into the pore 18 and contacts the contact plug 110.

For example, tungsten (W), metal silicides such as WSi and the like, and metal nitrides such as TiN and the like, can be employed as the under electrode 11. As the under electrode 11 is not limited thereto, and the materials of TiAlN, TiSiN, TiCN and the like, can also be employed. A silicon oxide film can be employed as the interlayer insulating layers 12 and 17.

The impurity diffusion layer 14 plays a role of a heat plug. When data is written, the impurity diffusion layer 14 becomes a portion of a heat element. An impurity doped n-type or p-type semiconductor is employed as the material of the impurity diffusion layer 14. As set forth, the n-type semiconductors are a silicon layer doped with phosphorous, and the like, which are grown by an epitaxial growth method. On the other hand, the p-type semiconductors are a silicon layer doped with boron, and the like, which are grown by the epitaxial growth method. Since these materials possess a relative low thermal conductivity rather than the under electrode 11, a heat-sink effect can be suppressed. By varying an impurity concentration that is doped in semiconductors, the electrical resistance can be easily controlled.

The nonvolatile memory device 10 comprises an interlayer insulating layer 19 which covers the surface of the interlayer insulating layer 12, and a pore 20 which passes through the interlayer insulating layer 19, just on the impurity diffusion layer 14. A portion of the phase change recording layer 15 is embedded into the pore 20, and contacts the impurity diffusion layer 14.

The phase change recording layer 15 is composed of the phase change materials. It is especially unlimited if the two phase states or more and the electrical resistance differences thereof exist in such phase change materials, as the phase change recording layer 15. For example, chalcogenide materials can be employed as the phase change materials. The chalcogenide materials are alloys that include at least one of germanium (Ge), antimony (Sb), tellurium (Te), indium (In), selenium (Se), and the like. As examples, binary alloys such as GaSb, InSb, InSe, $Sb_2Te_3$, GeTe, and the like, ternary alloys such as $Ge_2Sb_3Te_5$, InSbTe, GaSeTe (GST), $SnSb_2Te_4$, InSbGe, and the like, and quaternary alloys such as AgInSbTe, (GeSn)SbTe, GeSb(SeTe), $Te_{81}Ge_{15}Sb_2S_2$, and the like, are mentioned. The phase change materials comprising the chalcogenide materials can assume either the amorphous phase or the crystalline phase. The electrical resistance of the amorphous phase is relatively high while the electrical resistance of the crystalline phase is relative low FIG. 4 is a time chart that explains a unit of controlling the phase state of the phase change materials comprising the chalcogenide materials.

Figure 4:
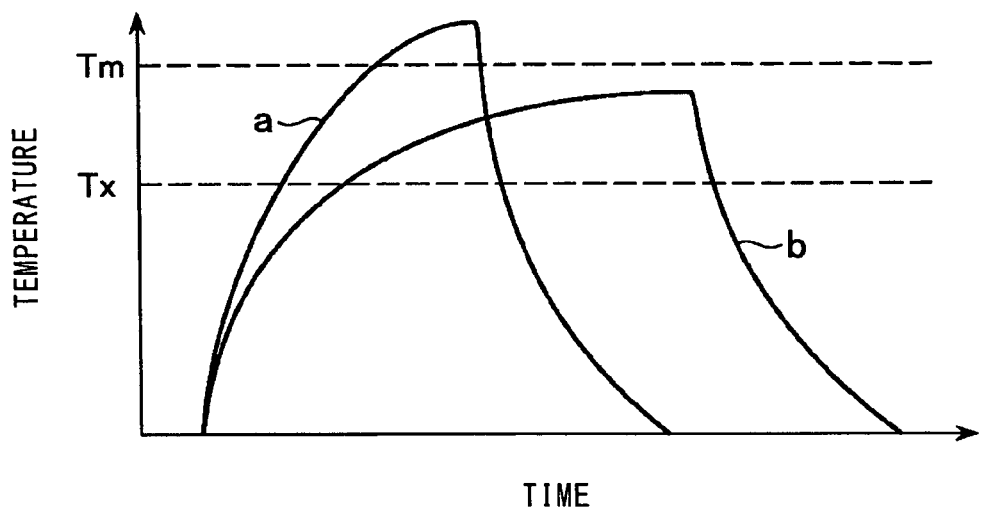
FIG. 4 is a time chart that explains a unit of controlling the phase state of the phase change material comprising chalcogenide materials.

In order to assume the phase change materials comprising the chalcogenide materials to be the amorphous phase, as shown in a curve "a" of FIG. 4, they should be heated at temperatures of a melting point Tm or more once, and then should be cooled. On the other hand, in order to assume the phase change materials comprising the chalcogenide materials to be the crystalline phase, they should be heated at the temperature ranging from a crystallization temperature Tx and the melting point Tm once, and then, should be cooled. The heating is demonstrated by energizing. The heating temperature is controlled by the amount of energizing, that is, the amount of the current, or energizing time.

An upper electrode 16 is conjugate with the under electrode 11. The materials having relative low thermal conductivity are suitable for the upper electrode 16 for thermal insulation of the heat that is generated by energizing. As set forth, metal nitrides and the other materials such as TiAlN, TiSiN, TiCN and the like, can be employed. The nonvolatile memory device 10 comprises an interlayer insulating layer 21 which covers the surface of the upper electrode 16, and a pore 22 which passes through the interlayer insulating layer 21, just on the upper electrode 16. The upper electrode 16 is connected with the bit line Bj via a contact plug 23 which is embedded into the pore 22.

The nonvolatile memory device 10 comprises a side gate electrode 14 which is located on an inner wall of the pore 13 into which the impurity diffusion layer 14 is embedded, and a side gate insulating layer 25 which is located between the side gate electrode 24 and the impurity diffusion layer 14, as an electric field application portion that applies an electric field to the impurity diffusion layer 14.

The side gate electrode 24 is provided and elongated along the depth direction on around an inner wall of the pore 13. In the memory cell, the side gate electrode 24 is provided conjunct with an electrode (solid electrode) 24a which uniformly covers the interlayer insulating layer 17 surface except the impurity diffusion layer (heat plug) 14 which is embedded into the pore 13. Tungsten (W), titanium (Ti), titanium nitride (TiN), aluminum (Al), copper (Cu), and poly silicon doped with phosphorous (P), and the like, can be employed as the side gate electrode 24.

A pore 26 which passes through the interlayer insulating layer 21, and a contact plug 27 which is embedded into the pore 26, are provided at an edge of the nonvolatile memory device 10. The contact plug 27 is connected with the solid electrode 24a at the edge of the nonvolatile memory device 10. A side gate control terminal 28 is provided on the contact plug 27.

The side gate insulating layer 25 insulates the side gate electrode 24 from the impurity diffusion layer 14, and, for example, is composed of a silicon nitride film and the like. The side gate insulating layer 25 is contained between the side gate electrode 24 and the impurity diffusion layer 14, and also between the side gate electrode 24 and the interlayer insulating layer 17.

According to the nonvolatile memory device 10, when the impurity diffusion layer (heat plug) 14 is composed of the n-type semiconductor, a negative voltage is applied to the side gate electrode 24 through the side gate control terminal 28, then an electrical field is applied to the impurity diffusion layer 14 via the side gate insulating layer 25, and so as a portion of the impurity diffusion layer 14 is depleted, as shown in FIG. 3B. As set forth, since a depletion layer 14a elongates from the inner wall of the pore 13 toward the inside thereof, an effective diameter φ of the impurity diffusion layer 14 which is embedded into the pore 13 becomes smaller than the diameter of the pore 13. Under such a condition, the current Ireset passes between the under electrode 11 and the upper electrode 16, so the effective diameter of the heat spot to change the phase state of the phase change recording layer 15 becomes smaller than the diameter of the pore 13. That is, the voltage has only to apply to the side gate electrode 24 to form the depletion layer 14a with an appropriate size in the impurity diffusion layer 14. By controlling the effective diameter φ of the impurity diffusion layer 14, it becomes possible to arbitrarily control the effective diameter of the heat spot to induce the phase change in the phase change recording layer 15. When the impurity diffusion layer (heat plug) 14 is composed of the p-type semiconductor, a positive voltage is applied to the side gate electrode 24 through the side gate control terminal 28, then a portion of the impurity diffusion layer 14 is depleted, and so it becomes possible to control the effective diameter φ of the impurity diffusion layer 14.

Therefore, according to the nonvolatile memory device 10, the heat spot to the phase change recording layer 15 decreases independent of the above mentioned process limit, thereby, the current path is concentrated so it becomes possible to decrease the Ireset. Since the impurity diffusion layer 14 is composed of materials having a lower thermal conductivity than the heat plug which is composed of metals having a higher thermal conductivity, it is possible to heat the phase change recording layer 15 (make the phase change) effectively through the smaller Ireset by decreasing the heat-sink effect. Therefore, according to the nonvolatile memory device 10, it becomes possible to lower power consumption together with large scale integration (making a large scale capacity) of the PRAM.

The PRAM enables writing and reading out of the data by activating any word lines among W1 through Wn by the row decoder 101 and followed by passing the current through at least one of the bit lines among B1 through Bn under such a condition. That is, for the memory cell MC with the corresponding word line W1 through Wn being activated, when the transistor 103 turns on, the corresponding bit line among B1 through Bn connects to the ground 109 via the nonvolatile memory device 10. Therefore, if the writing current passes through the selected bit line from among B1 through Bn by the column decoder 102 under such a condition, it is possible to make the phase change of the phase change recording layer 15 in the nonvolatile memory device 10.

As set forth, the phase change materials that compose the phase change recording layer 15 is heated at temperatures of a melting point Tm or more by a predetermined current application, and then cooled by cutting the current off rapidly, as shown in a "curve a" of FIG. 4. Thus, they assume the amorphous phase. On the other hand, the phase change materials that compose the phase change recording layer 15 are heated at a temperature ranging from the crystallization temperature Tx and the melting point Tm by a current smaller than the predetermined current, and then cooled by decreasing the current gradually, as shown in a "curve b" of FIG. 4. Thus, they assume the crystalline phase, due to an enhancement of crystal growth.

When the data is read out, the row decoder activates any one of the word lines among W1 through Wn, and, under such a condition, it only has to pass the reading current through at least one of the bit lines among B1 through Bn, wherein the reading current is set low enough not to change the phase state of the phase change recording layer 15. Since the electrical resistance of the memory cell MC is higher when the phase change recording layer 15 assumes the amorphous phase while the electrical resistance of the memory cell MC is lower in which the phase change recording layer 15 assumes the crystalline phase, if the amount of the current is detected by an unillustrated sense amplifier, the phase state of the phase change recording layer 15 can be revealed.

The phase state of the phase change recording layer 15 can correspond to a logical value to be memorized. For example, if the phase states of the amorphous phase and the crystalline phase are defined as "0" and "1", respectively, one memory cell MC can hold one bit data. When the phase state changes from the amorphous phase to the crystalline phase, a crystallization ratio can also be controlled as a multistage process or linearly by adjusting the time that maintains the temperature of the phase change recording layer 15 from the crystallization temperature Tx and the melting point Tm. If a mixing ratio of the amorphous phase and the crystalline phase is controlled as the multistage process by this method, the electrical resistance of the phase change recording layer 15 can be controlled as the multistage process. Therefore, one memory cell MC can hold two bits data or more. Moreover, if the mixing ratio of the amorphous phase and the crystalline phase is controlled linearly, analog data can be held.

Figure 5:
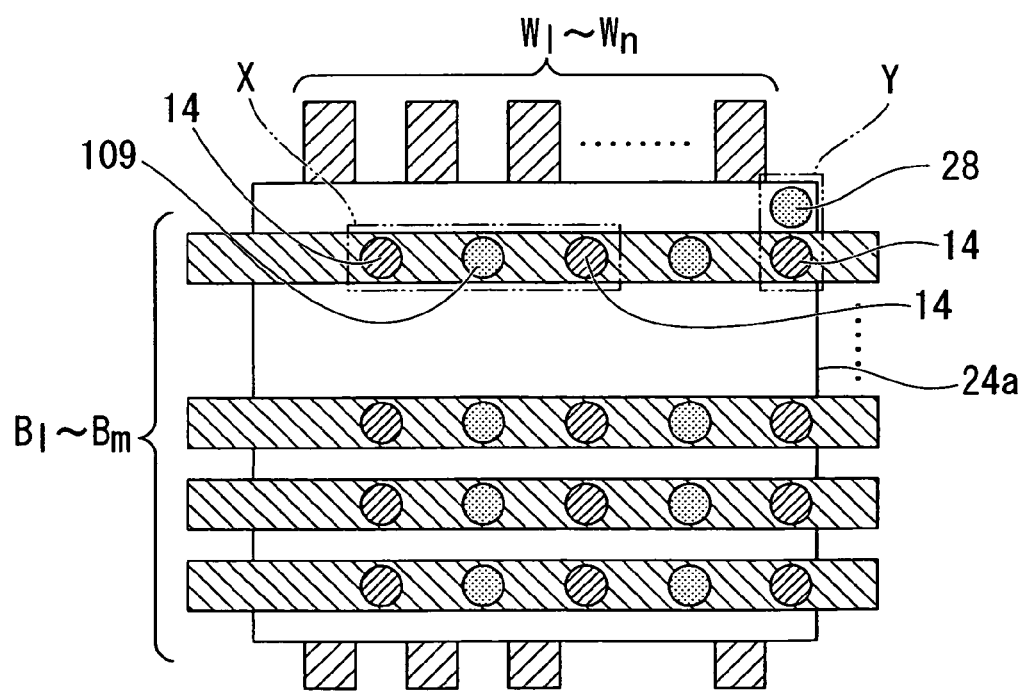
FIG. 5 is a plane view that shows a constitution of the memory cell array.
Figures 6A, 6B:
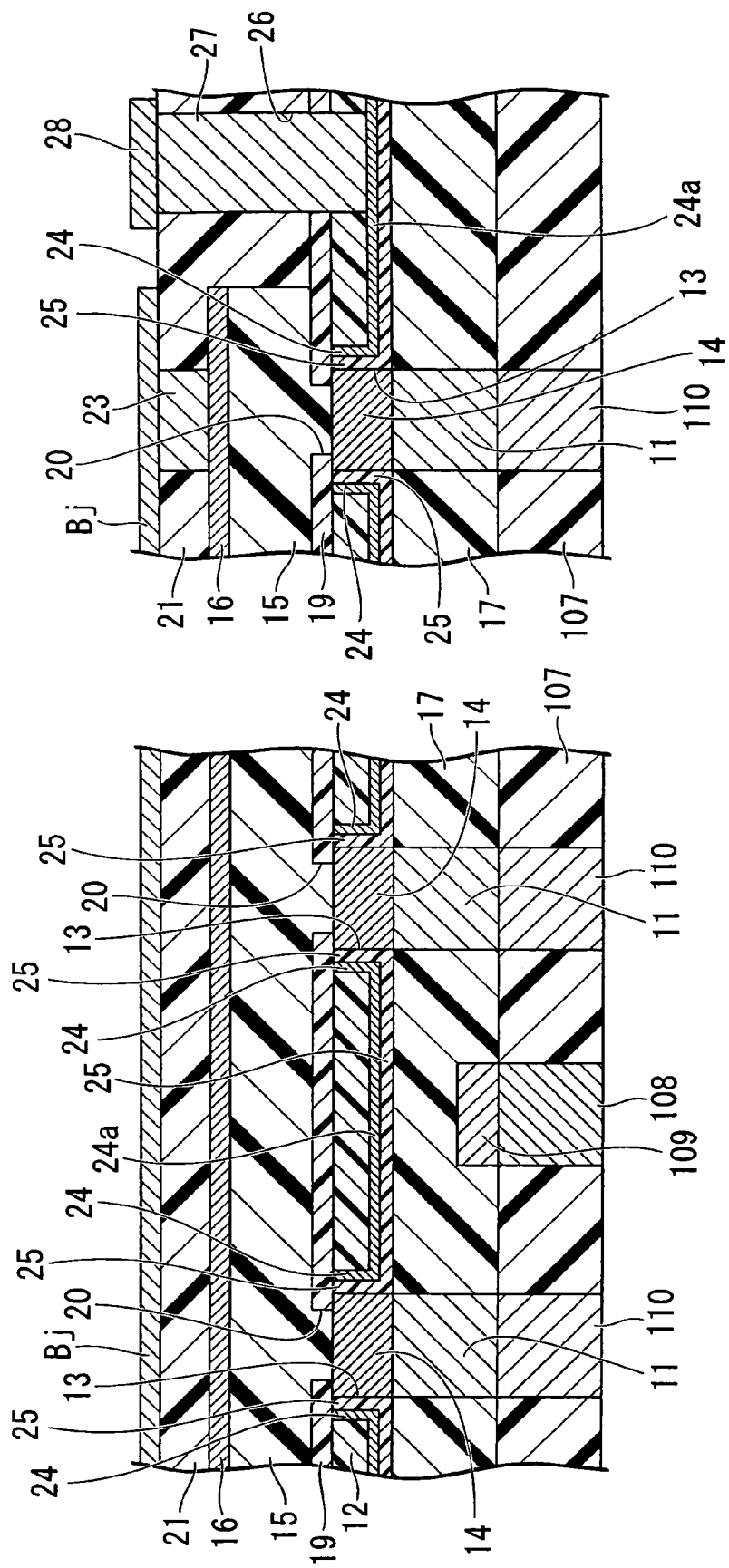
FIG. 6A and FIG. 6B are cross-sectional views that show the nonvolatile memory devices at the inner position X and the outer position Y, respectively, of the memory cell array shown in FIG. 5.

FIG. 5 is a plane view that shows the constitution of the memory cell array which is allocated regularly in the PRAM. FIG. 6A and FIG. 6B are cross-sectional views that show the nonvolatile memory devices at the inner position X and the outer position Y, respectively, of the memory cell array shown in FIG. 5. As shown in FIG. 5, FIG. 6A and FIG. 6B, in the PRAM, the side gate electrode 24 of the nonvolatile memory device 10 each forms the common solid electrode. An edge of the solid electrode is connected with the common side gate control terminal 28 via the contact plug 27. Therefore, when the data is written and read out, the voltage is applied from the common side gate control terminal 28 to the side gate electrode 24 of the nonvolatile memory device 10, in the PRAM.

Next, a production method of the PRAM which comprises the nonvolatile memory device is explained.

According to FIGS. 7A and 7B through FIGS. 24A and 24B that show each production process, FIG. 7A through FIG. 24A show the cross-sectional views that show the inner position of the memory cell array, while FIG. 7B through FIG. 24B show the cross-sectional views that show the outer position of the memory cell array.

When the PRAM which comprises the nonvolatile memory device is produced, a semiconductor substrate in which a plurality of two transistors 103 that constitute the memory cell MC of each PRAM is provided at the beginning, as shown in FIG. 7A and FIG. 7B. The transistor 103 is the MIS-FET which is fabricated by a conventional semiconductor production process. The explanation concerning the production process is omitted. Then, the interlayer insulating layer 17 is formed to cover the semiconductor substrate surface. After the pore 18 which passes through the interlayer insulating layer 17 is formed just on the contact plug 110, then, the under electrode 11 is embedded into the pore 18.

Next, as shown in FIG. 8A and FIG. 8B, an insulating layer 51 that covers the interlayer insulating layer 17 surface, and a conductive layer 52 that covers the insulating layer 51 surface are formed in sequence. The insulating layer 51 prevents the conductive layer 52 from directly contacting the under electrode 11. The insulating layer 51 also facilitates the process to remove a portion of the conductive layer 52 by the following process. In the present embodiment, the silicon oxide film having a layer thickness of about 20 nm is formed as the insulating layer 51, and the tungsten film having a layer thickness of about 10 nm is formed as the conductive layer 52.

Next, as shown in FIG. 9A and FIG. 9B, after the interlayer insulating layer 12 is formed on the conductive layer 52, the pore 13 which passes through the interlayer insulating layer 12 is formed just on the under electrode 11 by a lithographical technique. In the present embodiment, the silicon oxide film having a layer thickness of about 100 nm is formed as the interlayer insulating layer 12, and the diameter of the pore 13 is set to about 190 nm.

Next, as shown in FIG. 10A and FIG. 10, a conductive layer 53 that covers the interlayer insulating layer 12 surface is formed so the conductive layer 53 also covers the inner wall of the pore 13. The conductive layer 53 finally becomes the side gate electrode 24, and can be composed of the same materials as the conductive layer 52. In the present embodiment, the tungsten film having a layer thickness of about 10 nm is formed as the conductive layer 53.

Next, as shown in FIG. 11A and FIG. 11B, the conductive layer 53 is etched back so the conductive layers 52 and 53 and the insulating layer 51 which are deposited on the interlayer insulating layer 12 and a bottom plane of the pore 13 are removed. Therefore, the side gate electrode 24 is formed.

Figures 12A, 12B:
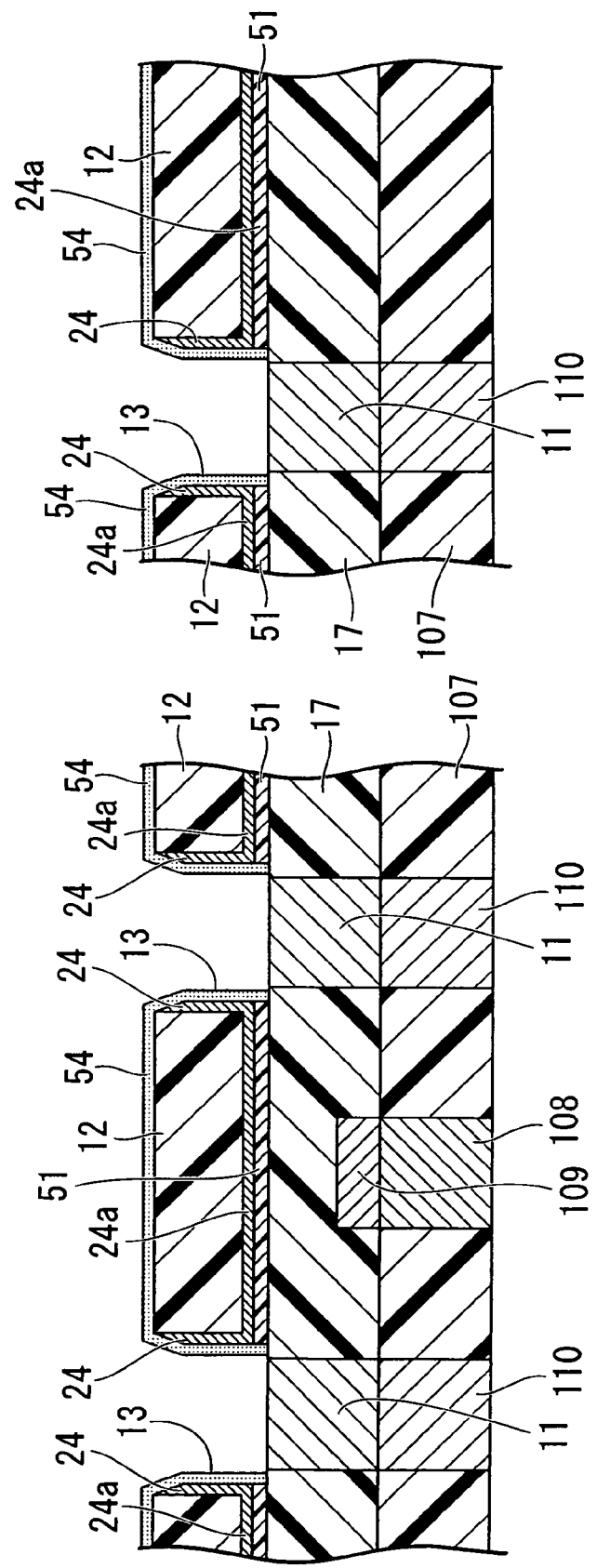
FIG. 12A and FIG. 12B are cross-sectional views that show a production process of a PRAM in sequence at the inner position X and the outer position Y, respectively, of the memory cell array shown in FIG. 5.

Next, as shown in FIG. 12A and FIG. 12B, an insulating layer 54 that covers the removed plane is formed so the insulating layer 54 covers the inner wall of the pore 13. Finally, the insulating layer 54 becomes the side gate insulating layer 25. In the present embodiment, the silicon nitride film having a layer thickness of about 10 nm is formed as the insulating layer 54.

Next, as shown in FIG. 13A and FIG. 13B, the insulating layer 54 is etched back so the insulating layer 54 which are deposited on the interlayer insulating layer 12 and a bottom plane of the pore 13 are removed. Therefore, the side gate insulating layer 25 is formed.

Figures 14A, 14B:
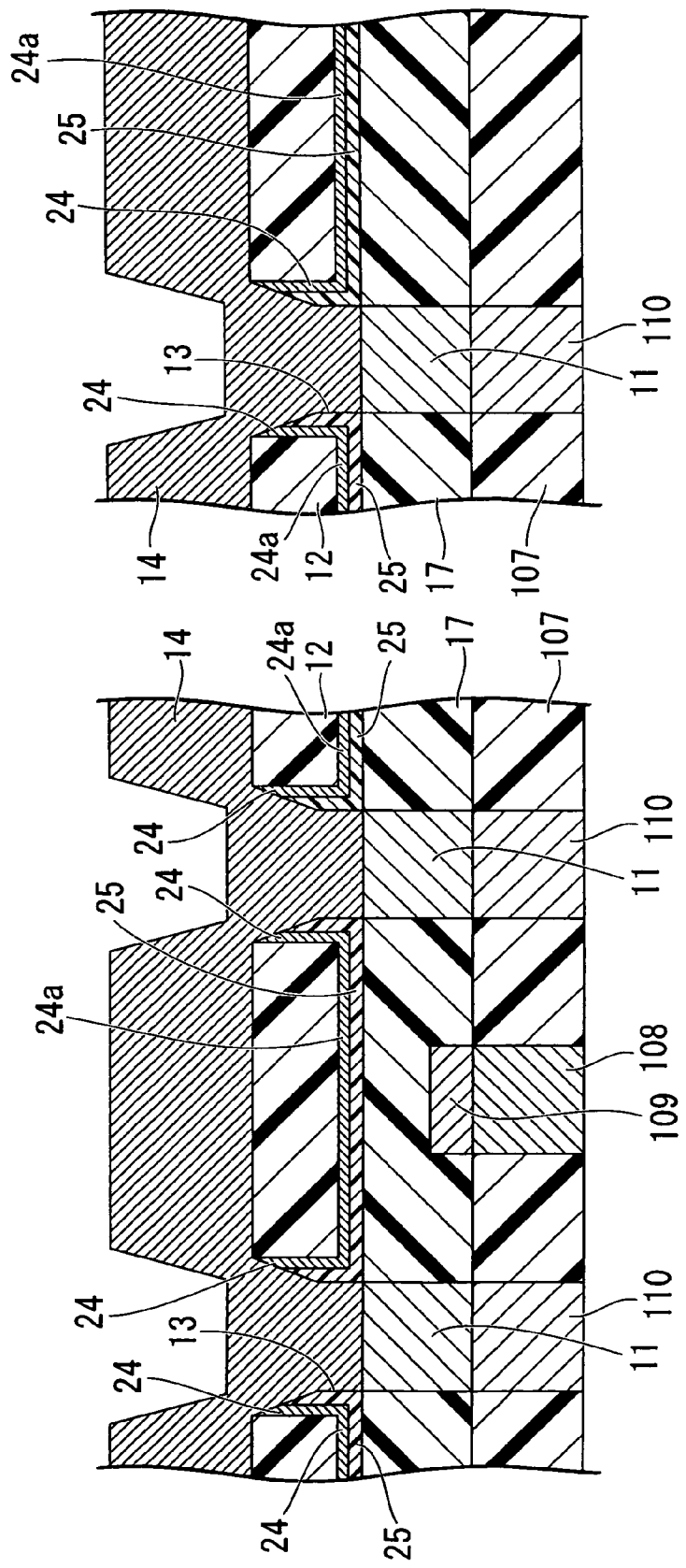
FIG. 14A and FIG. 14B are cross-sectional views that show a production process of a PRAM in sequence at the inner position X and the outer position Y, respectively, of the memory cell array shown in FIG. 5.

Next, as shown in FIG. 14A and FIG. 14B, the impurity diffusion layer 14 that covers the removed plane is formed so the impurity diffusion layer 14 is embedded into the pore 13. In the present embodiment, the n-type semiconductor film doped with phosphorus having a layer thickness of about 150 nm is epitaxial grown as the impurity diffusion layer 14. On the other hand, if the impurity diffusion layer 14 is composed of the p-type semiconductor, boron is doped instead of phosphorus.

Figures 15A, 15B:
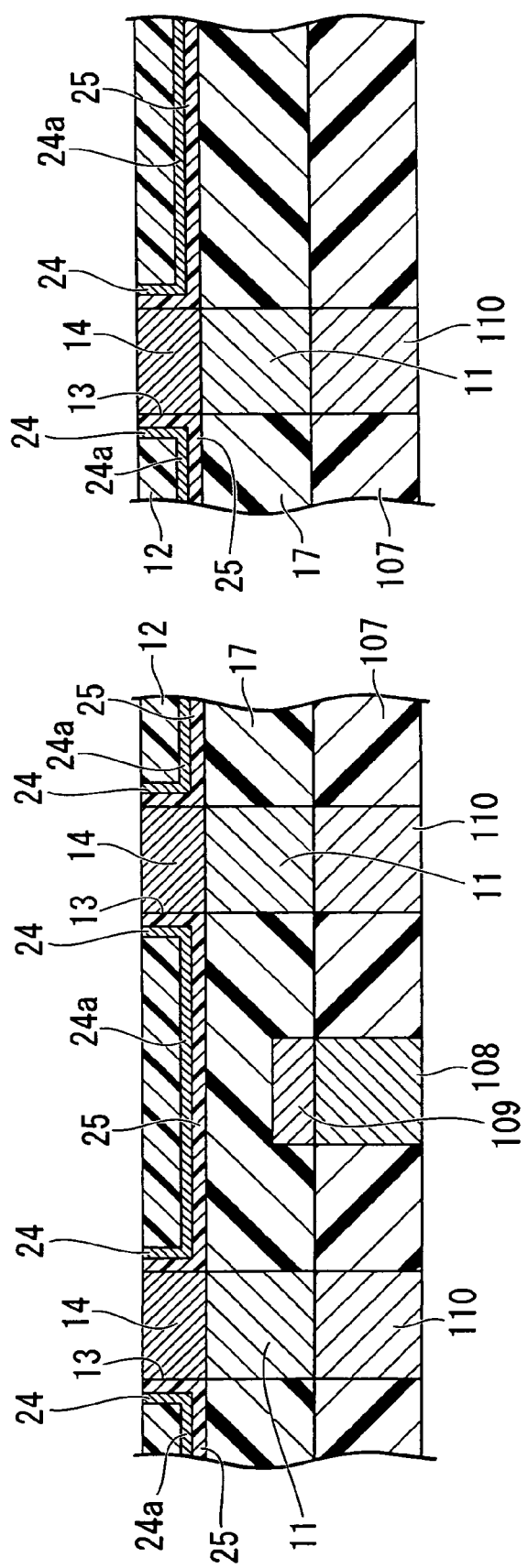
FIG. 15A and FIG. 15B are cross-sectional views that show a production process of a PRAM in sequence at the inner position X and the outer position Y, respectively, of the memory cell array shown in FIG. 5.

Next, as shown in FIG. 15A and FIG. 15B, the impurity diffusion layer 14 is polished to be a flat plane by chemical mechanical polishing (CMP). As a result, the condition wherein the impurity diffusion layer 14 is only embedded into the pore 14 appears.

Figure 16A:
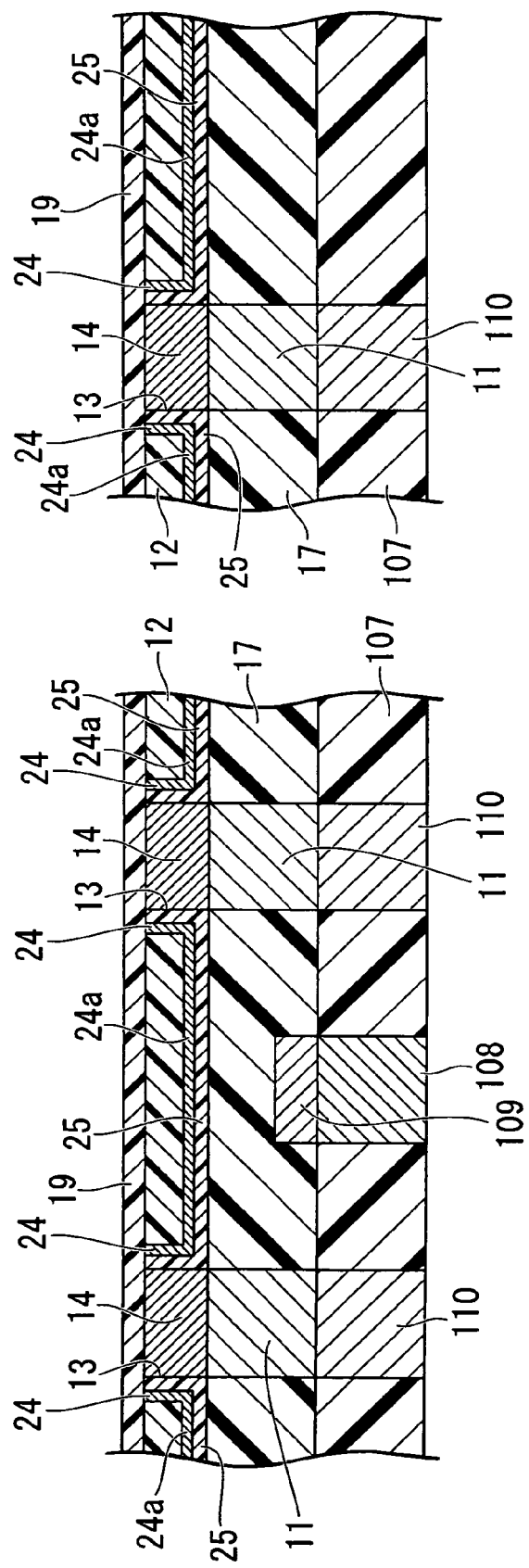
FIG. 16A and FIG. 16B are cross-sectional views that show a production process of a PRAM in sequence at the inner position X and the outer position Y, respectively, of the memory cell array shown in FIG. 5.
Figure 16B:
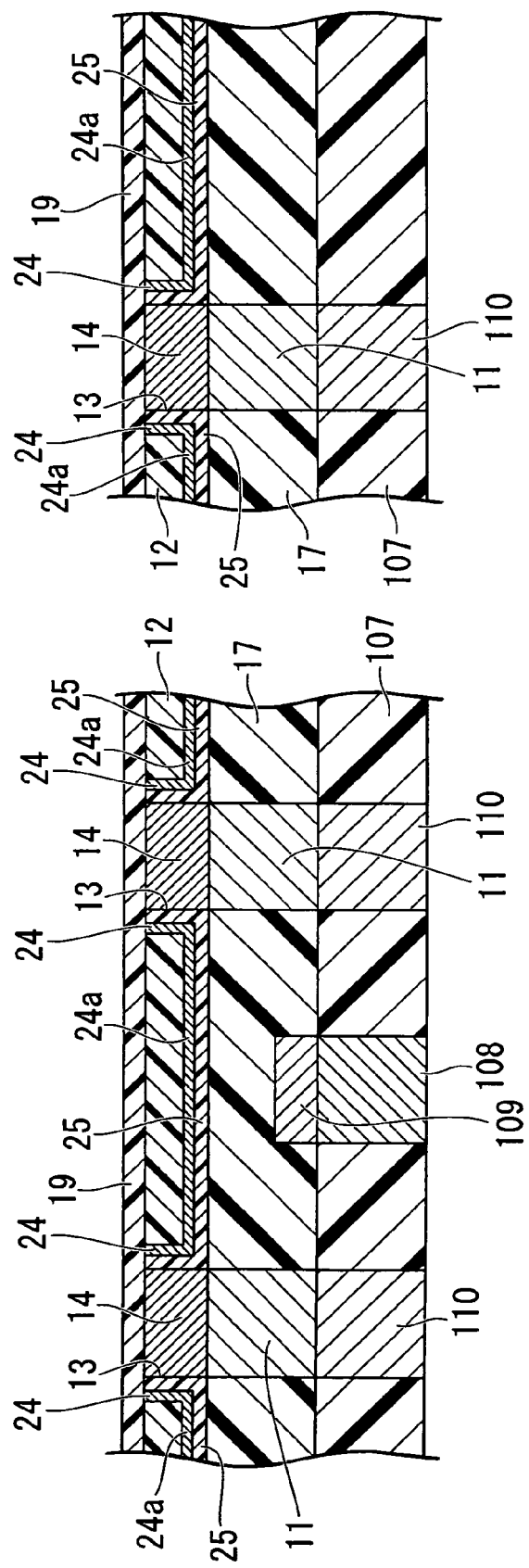

Next, as shown in FIG. 16A and FIG. 16B, the interlayer insulating layer 19 that covers the flat plane is formed. In the present embodiment, the silicon oxide film having a layer thickness of about 20 nm is formed as the interlayer insulating layer 19.

Next, as shown in FIG. 17A and FIG. 17B, the pore 20 which passes through the interlayer insulating layer 19 is formed just on the impurity diffusion layer 14. In the present embodiment, the diameter of the pore 20 is set to about 100 nm.

Figure 18B:
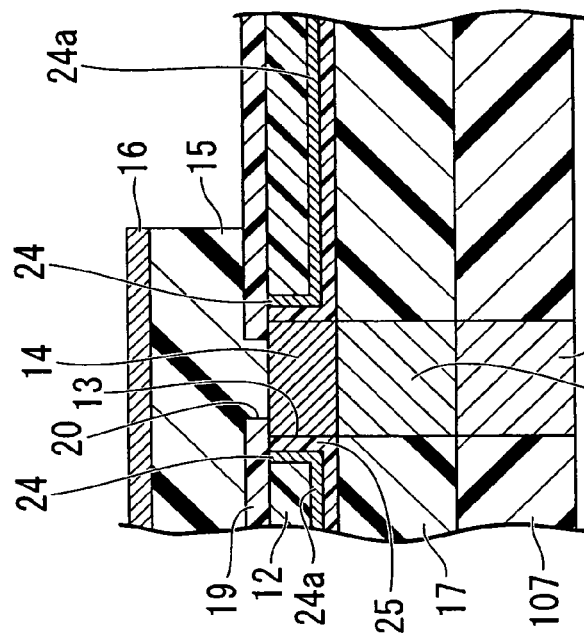
FIG. 18A and FIG. 18B are cross-sectional views that show a production process of a PRAM in sequence at the inner position X and the outer position Y, respectively, of the memory cell array shown in FIG. 5.
Figure 18A:
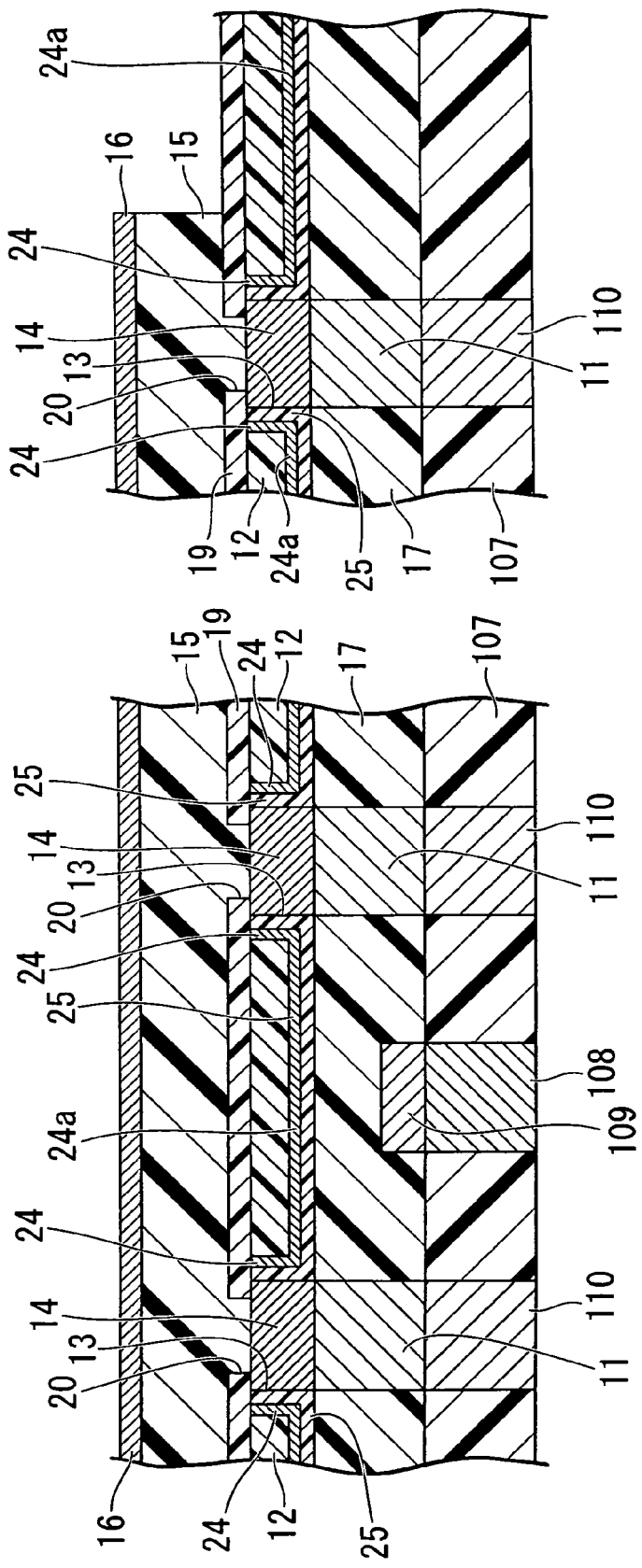

Next, as shown in FIG. 18A and FIG. 18B, after the phase change recording layer 15 and the upper electrode 16 are formed in sequence, the phase change recording layer 15 and the upper electrode 16 are subjected to a patterning process so the phase change recording layer 15 and the upper electrode 16 are removed at the outer position of the memory cell array. In the present embodiment, the GeTeSe film having a layer thickness of about 100 nm is formed as the phase change recording layer 15, and the TiN film having a layer thickness of about 50 nm is formed as the upper electrode 16.

Next, as shown in FIG. 19A and FIG. 19B, the interlayer insulating layer 21 that covers the upper electrode 16 surface is formed. In the present embodiment, the silicon oxide film having a layer thickness of about 200 nm is formed as the interlayer insulating layer 21.

Figure 20B:
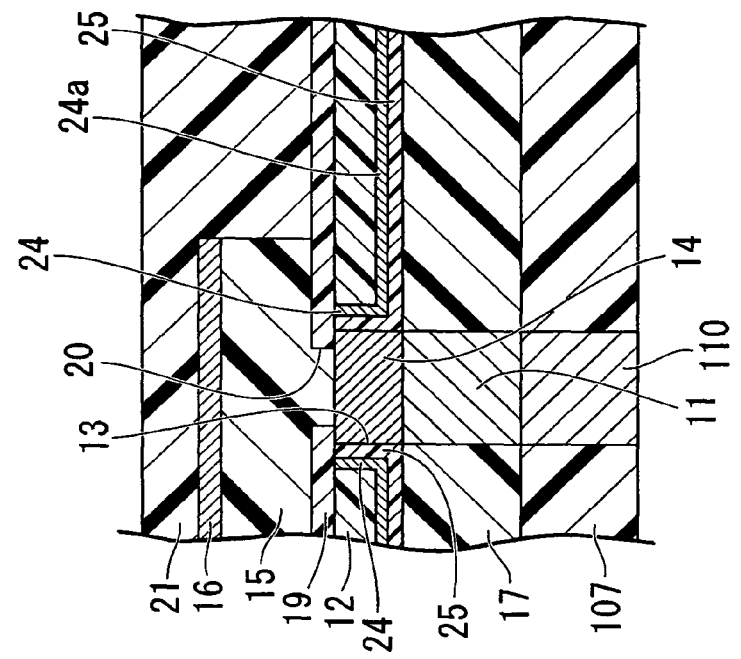
FIG. 20A and FIG. 20B are cross-sectional views that show a production process of a PRAM in sequence at the inner position X and the outer position Y, respectively, of the memory cell array shown in FIG. 5.
Figure 20A:
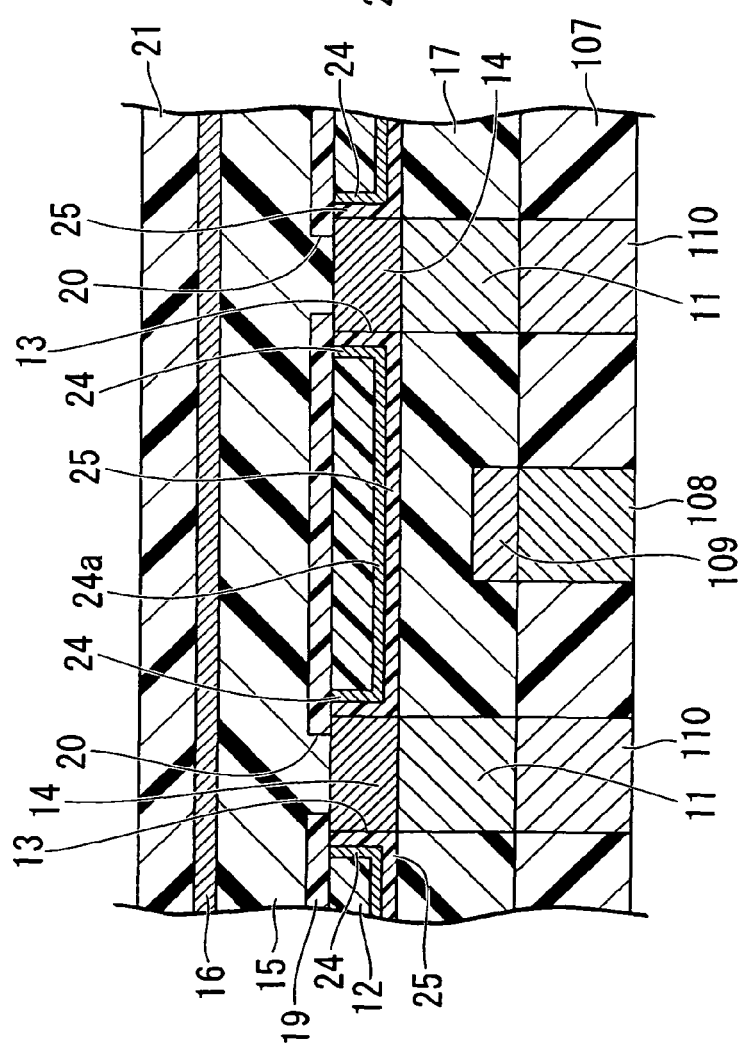

Next, as shown in FIG. 20A and FIG. 20B, the interlayer insulating layer 21 is polished to be a flat plane by the CMP.

Figures 21A, 21B:
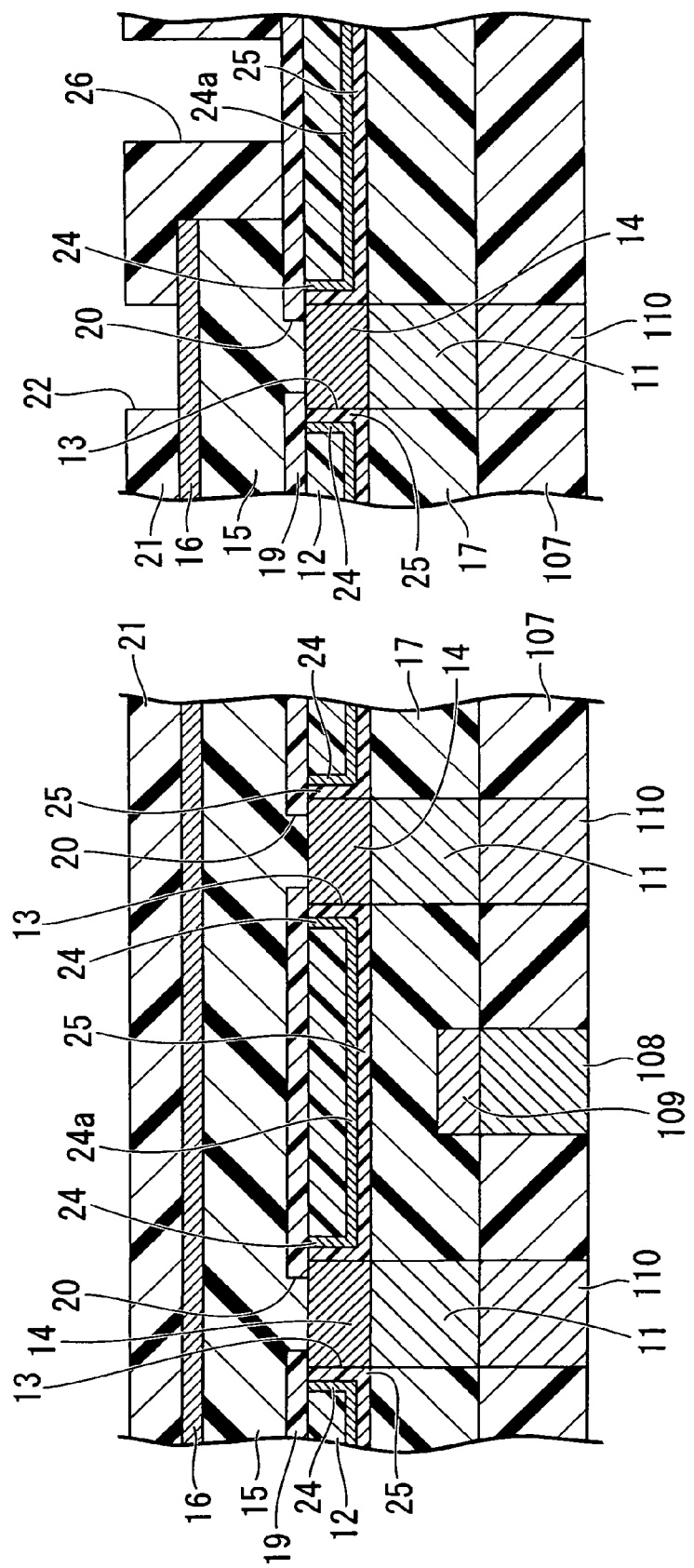
FIG. 21A and FIG. 21B are cross-sectional views that show a production process of a PRAM in sequence at the inner position X and the outer position Y, respectively, of the memory cell array shown in FIG. 5.

Next, as shown in FIG. 21A and FIG. 21 B, the pore 22 which passes through the interlayer insulating layer 21 is formed just on the upper electrode 16, and the pore 26 which passes through the interlayer insulating layer 21 is formed at the outer position of the memory cell array.

Figures 22A, 22B:
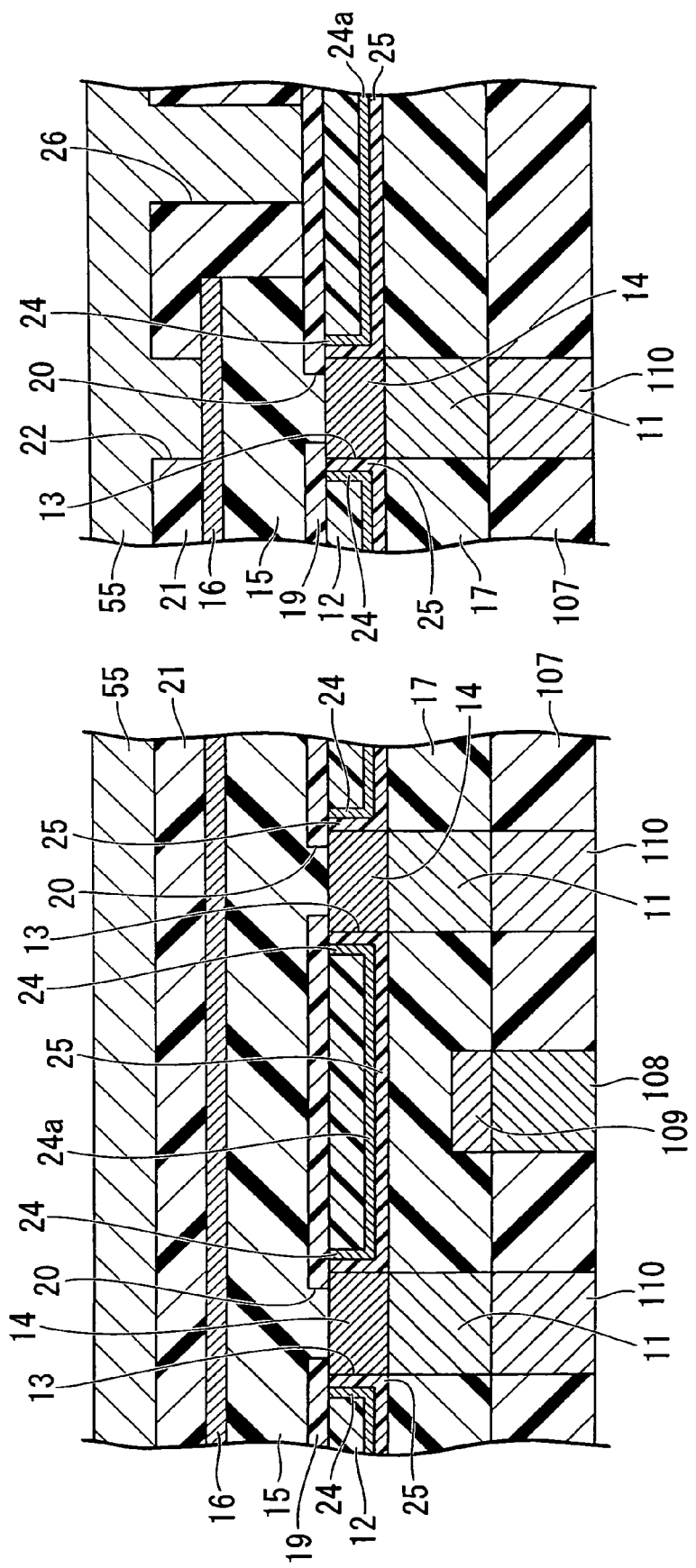
FIG. 22A and FIG. 22B are cross-sectional views that show a production process of a PRAM in sequence at the inner position X and the outer position Y, respectively, of the memory cell array shown in FIG. 5.

Next, as shown in FIG. 22A and FIG. 22B, a conductive layer 55 that covers the interlayer insulating layer 21 surface is formed so the condition wherein the conductive layer 55 is embedded into the pores 22 and 26 appears. In the present embodiment, the tungsten film is formed as the conductive layer 55 to have an enough layer thickness, wherein the tungsten film is embedded into the pores 22 and 26.

Figures 23A, 23B:
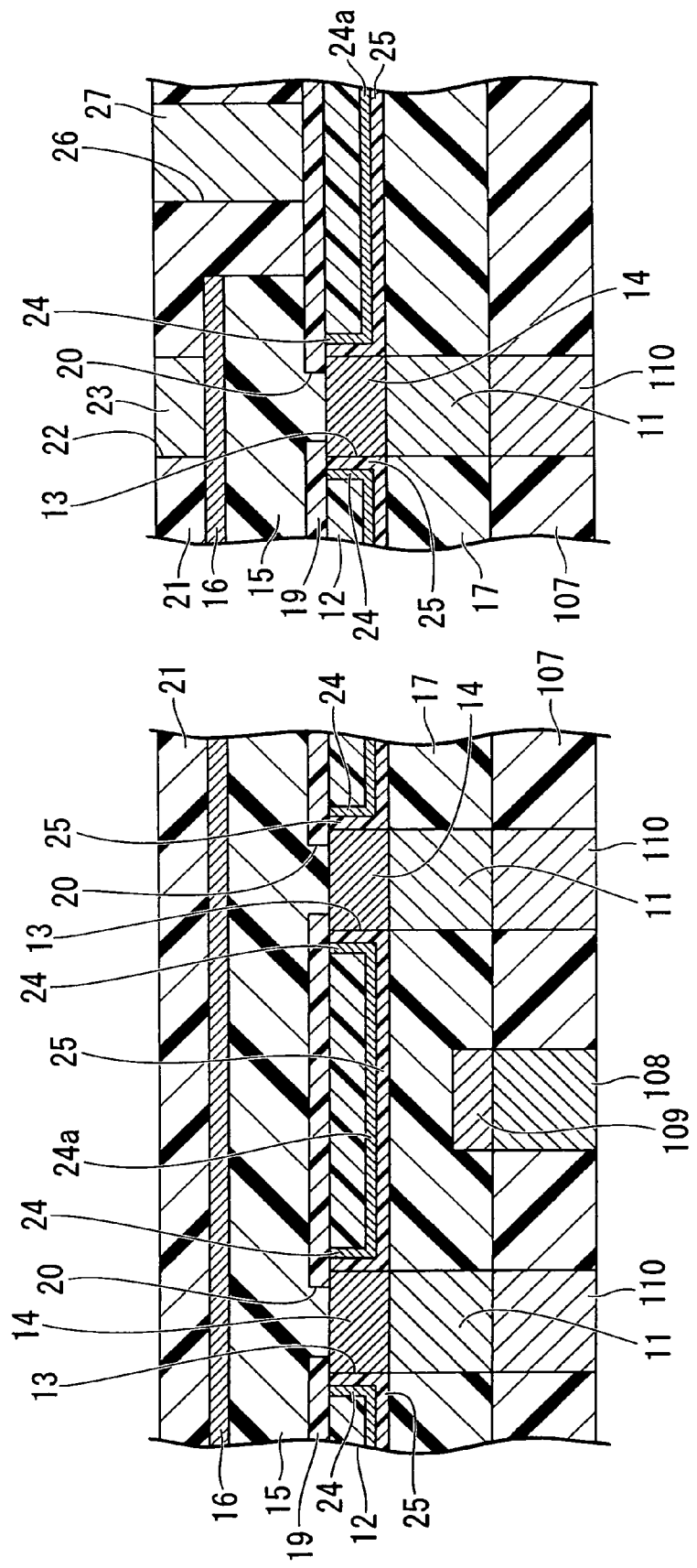
FIG. 23A and FIG. 23B are cross-sectional views that show a production process of a PRAM in sequence at the inner position X and the outer position Y, respectively, of the memory cell array shown in FIG. 5.

Next, as shown in FIG. 23A and FIG. 23B, the conductive layer 55 is polished to be a flat plane by the CMP. As a result, the contact plug 23 which is embedded into the pore 22, and the contact plug 27 which is embedded into the pore 26 appears.

Figures 24A, 24B:
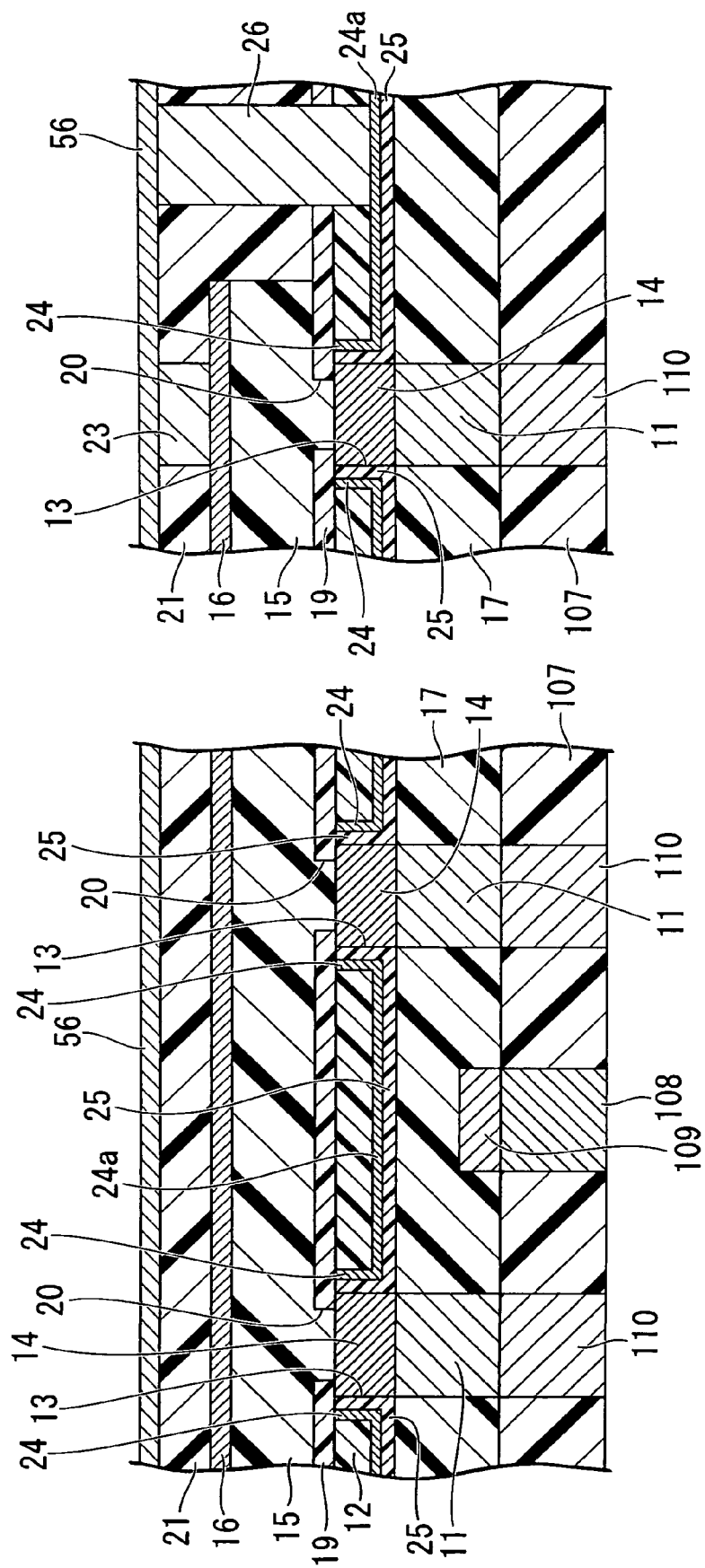
FIG. 24A and FIG. 24B are cross-sectional views that show a production process of a PRAM in sequence at the inner position X and the outer position Y, respectively, of the memory cell array shown in FIG. 5.

Next, as shown in FIG. 24A and FIG. 24B, a conductive layer 56 that covers the flattened surface is formed. The conductive layer 56 becomes the bit line Bj and the side gate control terminal 28 in final. In the present embodiment, the titanium nitride film having a layer thickness of about 50 nm and an aluminum-copper alloy (AlCu) film having a layer thickness of about 250 nm thereon are formed as the conductive layer 56.

Then, the conductive layer 56 is subjected to the patterning process that corresponds to the bit line Bj and the side gate control terminal 28 so the nonvolatile memory device that is shown in FIG. 6A and FIG. 6B can be obtained. Regarding an area other than the memory cell array in the PRAM, that is the sense amplifier, the decoder, and the other circuits that control the input and output of the memorized data, the circuit that makes a desired operation is formed, comprising the MISFET which is fabricated by the conventional semiconductor production process. Therefore, the PRAM is completed by combining the circuit with the memory cell array.

The present invention is not to be considered as limiting within the embodiment. Additions, omissions, substitutions, and other modifications can be made without departing from the spirit or scope of the present invention. Hereinafter, the explanation concerning equivalent parts or units to the nonvolatile memory device 10 is omitted and the same reference numbers are assigned thereof in the drawings.

Figure 25:
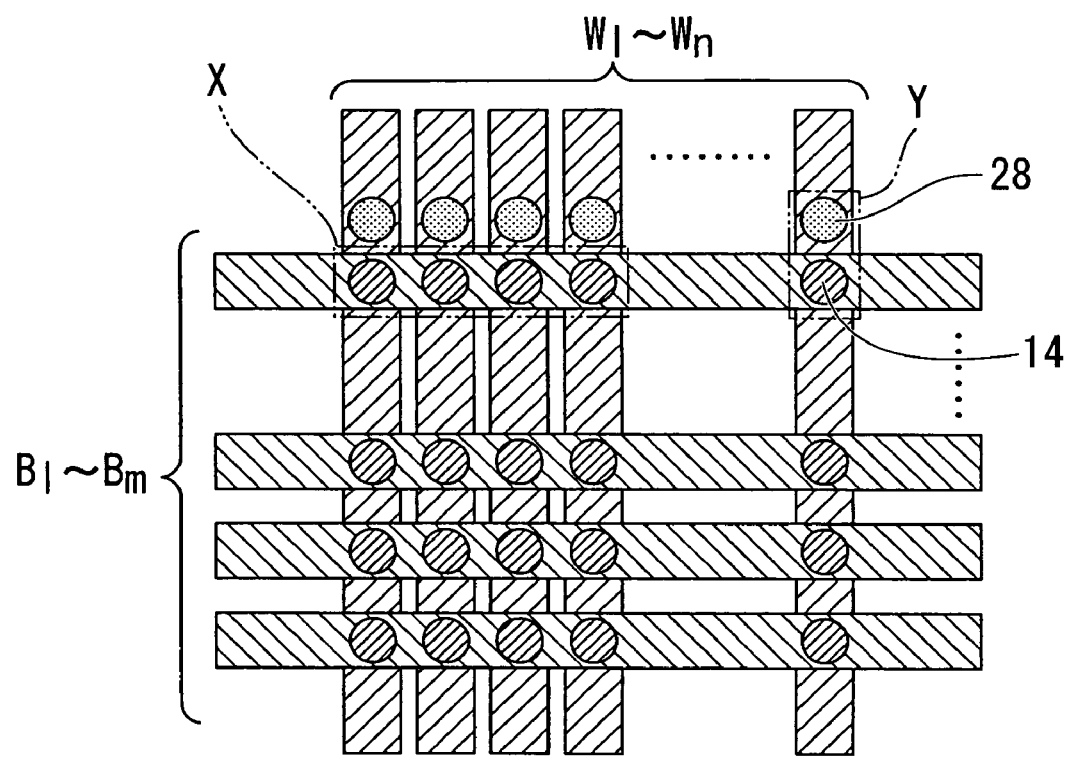
FIG. 25 is a plane view that shows another constitution of the memory cell array.

For example, FIG. 25 is a plane view that shows another constitution of the memory cell array. FIG. 26A and FIG. 26B are cross-sectional views that show the nonvolatile memory devices of the inner position X and the outer position Y, respectively, of the memory cell array shown in FIG. 25.

Figure 27A:
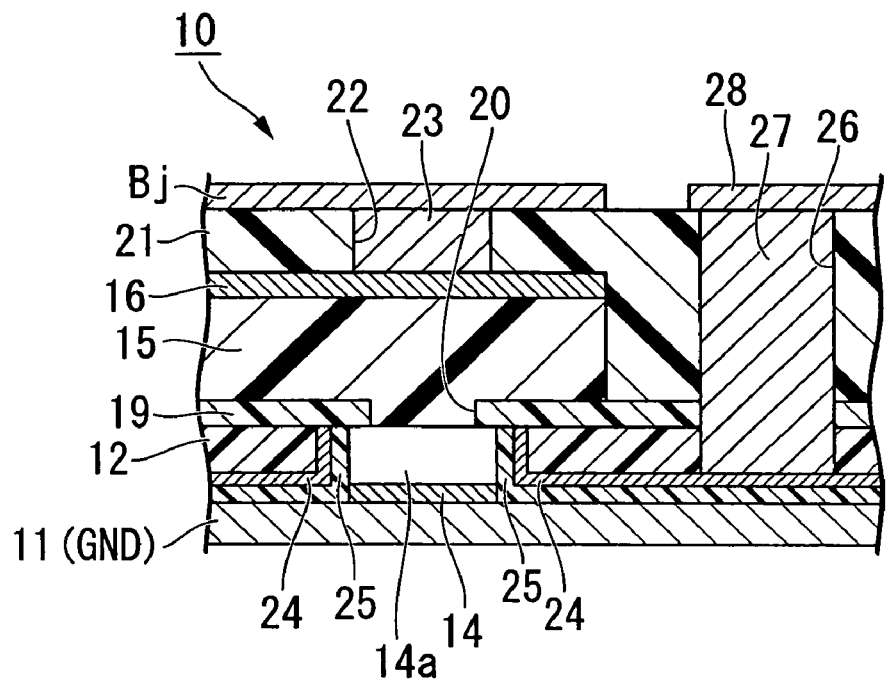
FIG. 27A and FIG. 27B are cross-sectional views that show the nonvolatile memory devices in situations of a word line being unselected and selected.
Figure 27B:
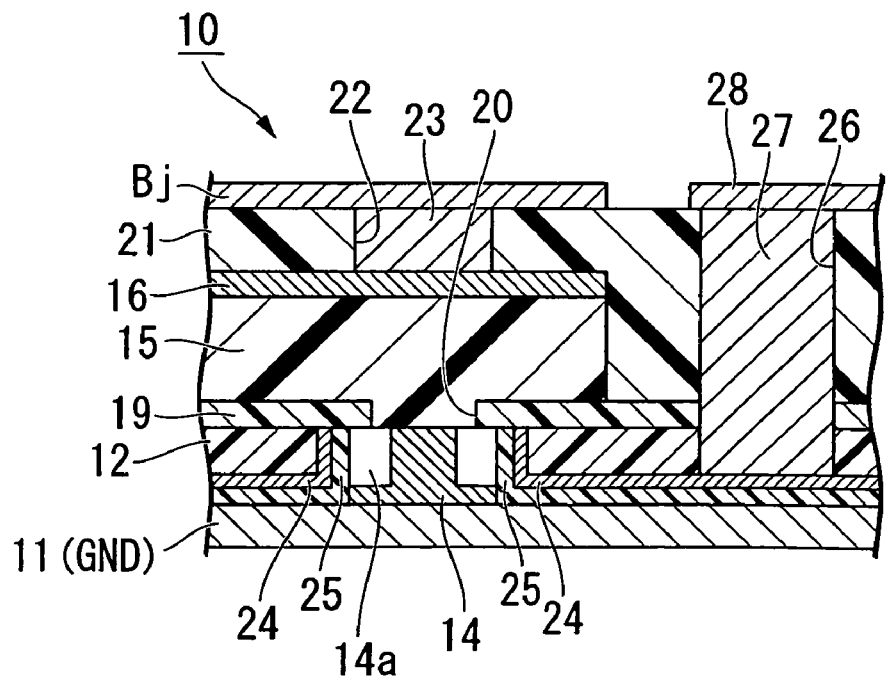

FIG. 27A and FIG. 27B are cross-sectional views that show the nonvolatile memory devices when the word line is unselected and selected, respectively.

In the memory cell array, each side gate electrode 24 of the nonvolatile memory device 10 each is formed to behave as the corresponding word line among W1 through Wn, as shown in FIG. 25, FIG. 26A, and FIG. 26B. The space between the side gate electrodes 24 of the nonvolatile memory device 10 is insulated form each of the word lines W1 through Wn. Moreover, an edge of the each word line among W1 through Wn connects with the side gate control terminal 28 via the contact plug 27. According to the PRAM, the under electrode 11 of the nonvolatile memory device 10 each forms the common solid electrode (GND) that corresponds to the ground line 109 in the embodiment. The under electrode 11 is provided via the unillustrated interlayer insulating layer which is formed on the semiconductor substrate. The other constitute is the same as the nonvolatile memory device 10.

According to the PRAM, a voltage $V_{SG}$ is applied to the side gate electrode 24, that is, the unselected word line, in the nonvolatile memory device 10 that connects with the word line being unselected, as shown in FIG. 27A. In this case, the voltage $V_{SG}$ that is applied to the side gate electrode 24 is defined as a voltage $V_{SG1}$ that depletes the impurity diffusion layer 14 completely ($V_{SG}=V_{SG1}$). Therefore, the current that passes through the impurity diffusion layer 14 is shut off. A polarity of the applied voltage $V_{SG}$ is determined by a conductive type of the impurity diffusion layer 14.

On the contrary, according to the nonvolatile memory cell 10 that connects with the word line being selected, a voltage $V_{SG2}$ that is applied to the side gate electrode 24, that is, the selected word line, is set lower than the $V_{SG2}$, as shown in FIG. 27B ($V_{SG}=|V_{SG2}|<|V_{SG1}|$). Therefore, a portion of the impurity diffusion layer 14 is depleted (a depletion layer 14a) so the effective diameter of the impurity diffusion layer 14 decreases and the current can pass therethrough.

In the PRAM, as described above, the voltage that applies to the side gate electrode 24 of the nonvolatile memory device 10 can be controlled via the word line W1 through Wn. In this manner, the heat region (heat spot) focuses on the phase change recording layer 15, so the current path can not only be concentrated, but the nonvolatile memory device 10 also possesses a function that the current is completely shut off. Therefore, a constitution can be realized so that the transistor 103 which is provided under the nonvolatile memory device 10 in the embodiment is unnecessary. For this reason, it is possible to easily enhance the integration degree of the memory cell.

Figure 28A:
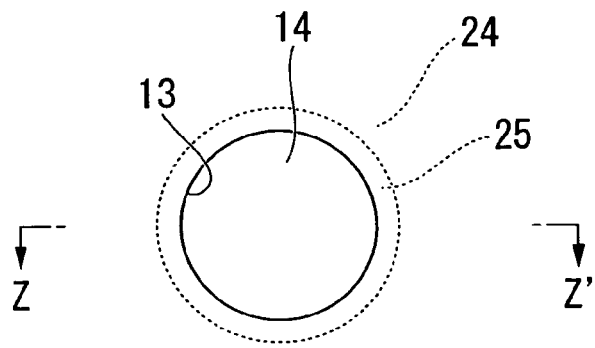
FIG. 28A and FIG. 28B are a plane view and cross-sectional view, respectively, that show an example of a modification of the nonvolatile memory device.
Figure 28B:
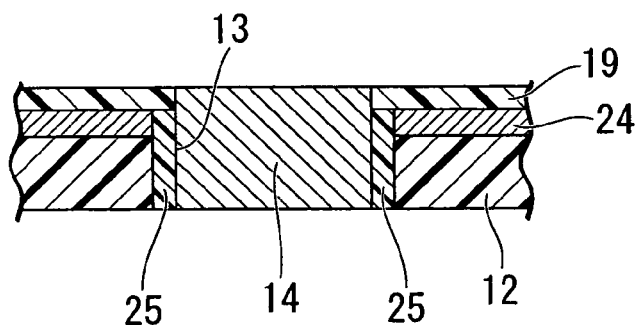
Figure 29:
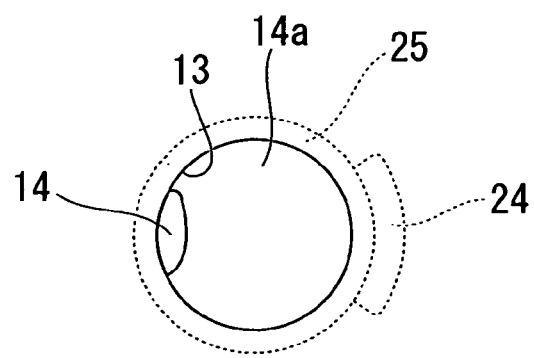
FIG. 29 is a plane view that shows an example of a modification of the nonvolatile memory device.

With respect to the side gate electrode 24, it is not necessary to limit the above mentioned constitution, wherein the side gate electrode 24 is provided and elongated along the depth direction on the inner wall of the pore 13. For example, the side gate electrode 24 which is shown in FIG. 28A and FIG. 28B is provided to have an elongating length that identifies the thickness thereof at the inner wall of the pore 13. Therefore, it has only to decrease the effective diameter of the impurity diffusion layer 14 at the at least area of interface between the impurity diffusion layer 14 and the phase change recording layer 15. Thus, it is not necessary to limit the constitution, wherein the side gate electrode 24 is provided and elongated along the depth direction on the inner wall of the pore 13. FIG. 28B is a cross-sectional view that shows a Z-Z' part shown in FIG. 28A. Alternately, the side gate electrode 24 may be provided not only in the constitution, wherein the side gate electrode 24 is provided all around the inner wall of the pore 13, but also in a constitution, for example, as shown in FIG. 29, wherein the side gate electrode 24 is provided only on a portion of the inner wall of the pore 13.

Alternately, if the side gate electrode 24 is provided and elongated along the depth direction on the inner wall of the pore 13, the space between the side gate electrodes 24 of the adjacent memory cells MC 10 may make a connection at an upside of the side gate electrode 24 that elongates along the depth direction of the pore 13. In order to take this constitution, after the formation of a stacking layer including the interlayer insulating layer 12, a conductive layer to become the side gate electrode 24 and the side gate insulating layer 25 are stacked in this order, the pore 13 is formed to pass through the stacking layer, and the conductive layer to become the side gate electrode 24 is formed again and etched back to remain the side gate electrode 24 on the inner wall of the pore 13. After that, the side gate insulating layer 25 is formed again and etched back to remain the side gate electrode 24 only on the inner wall of the pore 13, and the impurity diffusion layer is embedded.

Figure 30:
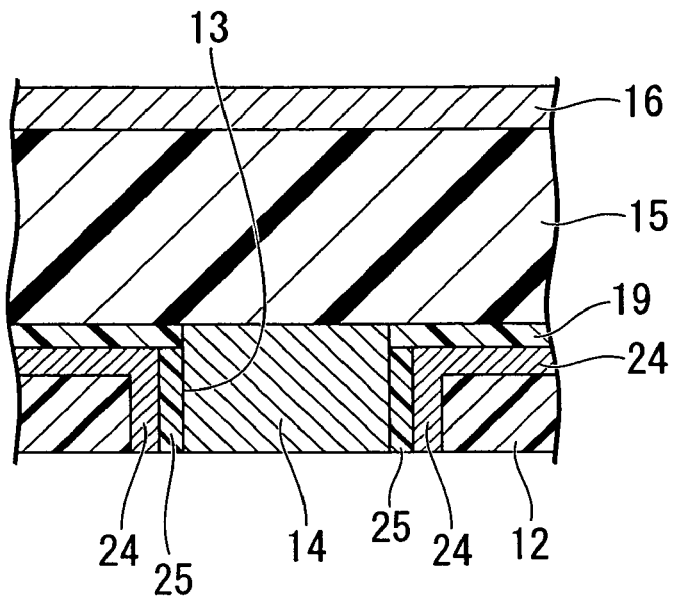
FIG. 30 is a cross-sectional view that shows an example of a modification of the nonvolatile memory device.
Figure 31:
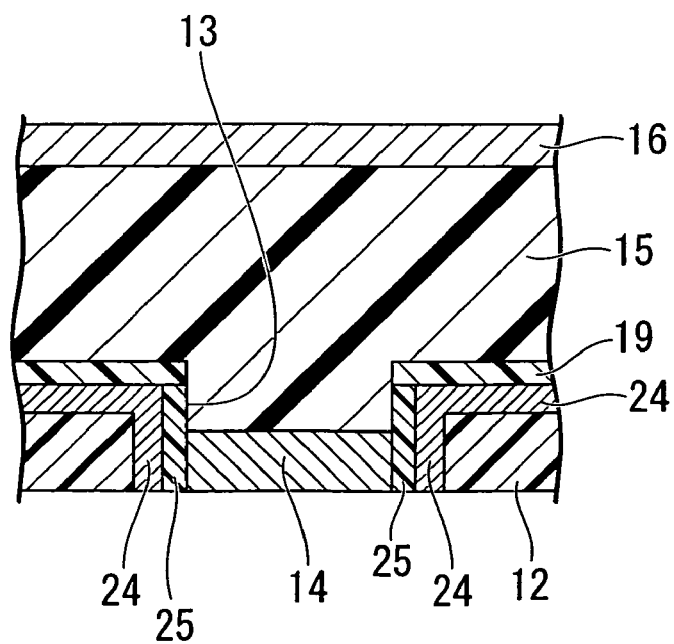
FIG. 31 is a cross-sectional view that shows an example of a modification of the nonvolatile memory device.

Alternately, the phase change recording layer 15 may be provided not only in the constitution, wherein a portion of the phase change recording layer 15 is embedded into the pore 13, but also in a constitution, for example, as shown in FIG. 30, wherein the phase change recording layer 15 is provided on the plane that identifies both the interlayer insulating layer 19 surface and the impurity diffusion layer 14 surface. Alternately, the phase change recording layer 15 may be provided in a constitution wherein a portion of the phase change recording layer 15 is embedded into the pore 13 of the interlayer insulating layer 12 and contacted to the impurity diffusion layer 14 within the pore 13.

Figure 32A:
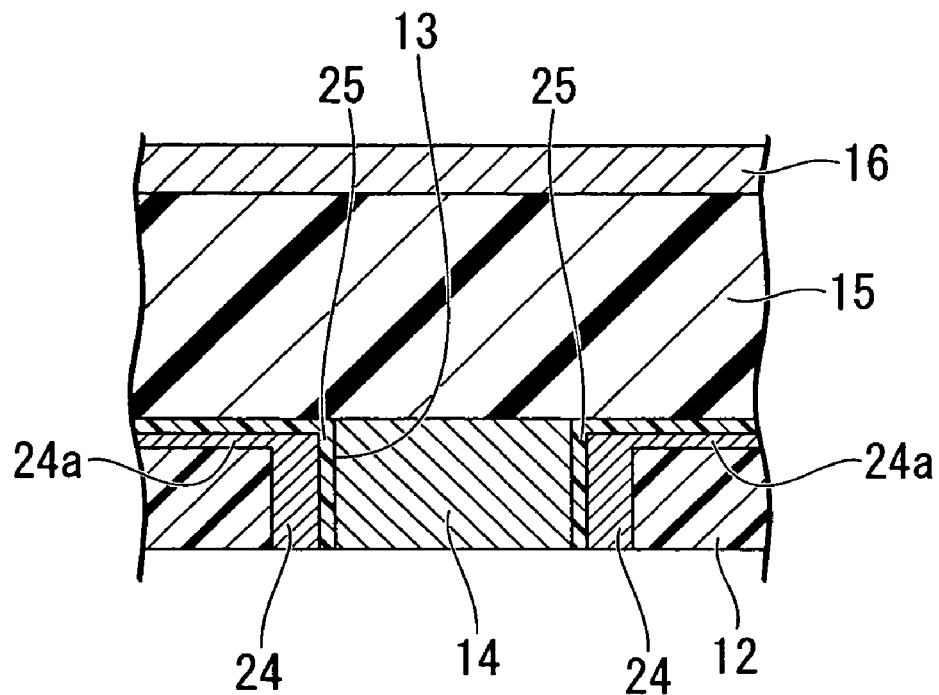
FIG. 32A and FIG. 32B are cross-sectional views that show examples of a modification of the nonvolatile memory device.
Figure 32B:
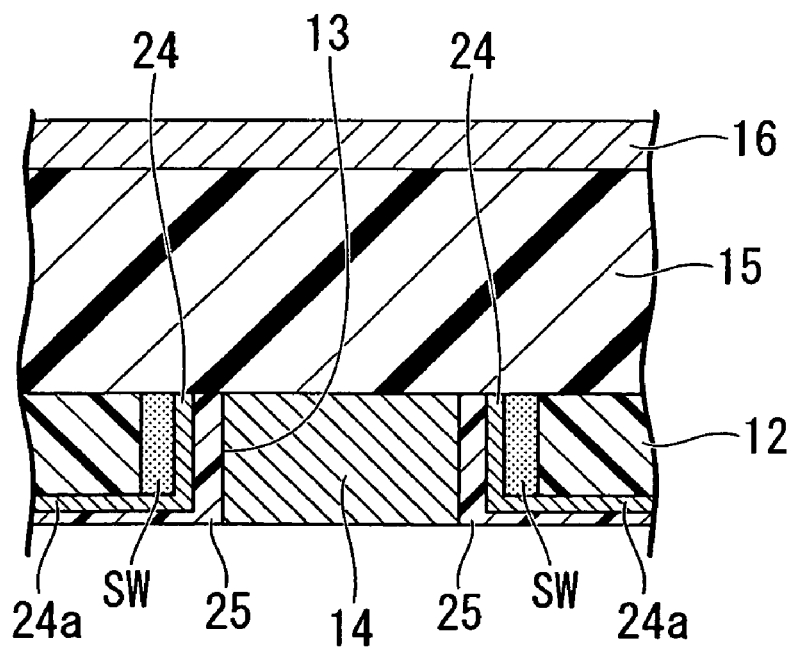
Figure 33:
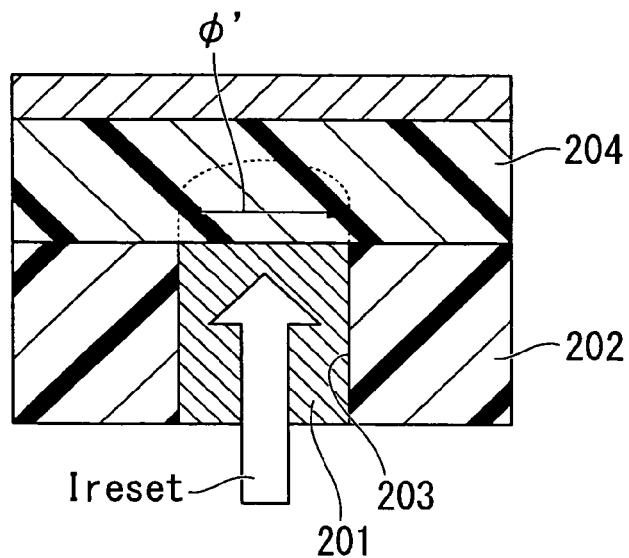
FIG. 33 is a cross-sectional view that shows a constitution of a conventional PRAM.
Figure 34:
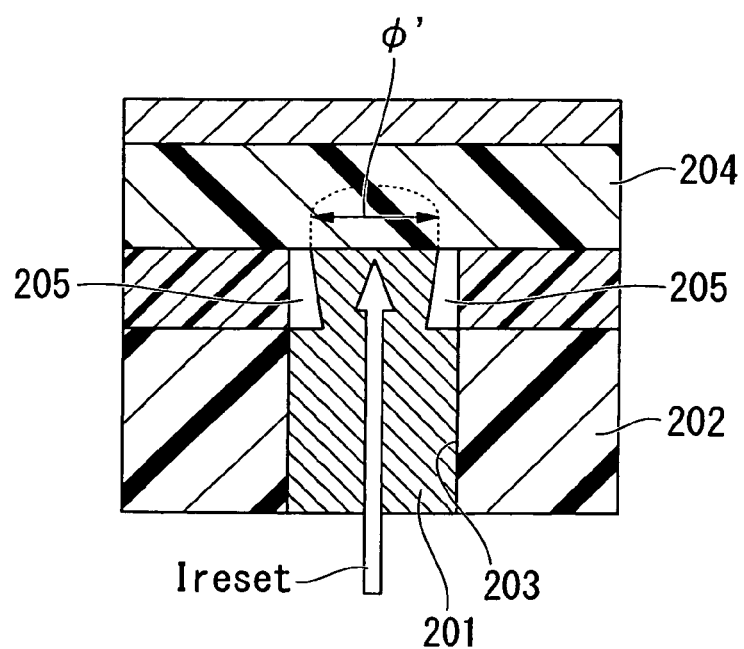
FIG. 34 is a cross-sectional view that shows the constitution of a conventional PRAM.

Alternately, according to the nonvolatile memory device 10, as shown in FIG. 32A and FIG. 32B, the impurity diffusion layer 14 may be formed after the pore 13 is opened as usual by the photolithographical technique, and the physical dimension of the pore 13 decreases. As set forth, as shown in FIG. 32A, the diameter of the impurity diffusion layer 14 can decrease if the layer thickness of the conductive layer 53 to become the side gate electrode 24 is provided as being thicker than the conductive layer 52 to become the side gate electrode 24a. Alternately, as shown in FIG. 32B, the diameter of the impurity diffusion layer 14 can decrease if after the pore 13 is formed by the abovementioned production process shown in FIG. 9A and FIG. 9B, a side wall SW is made from the silicon nitride film and the like, and then followed by the processes that are shown in FIG. 10A and FIG. 10B thereafter. Since it is difficult to decrease the diameter of the pore 13 beyond a resolution of irradiation to a photoresist film, it is possible to easily obtain the impurity diffusion layer 14 (heat plug) which is reduced to an appropriate size for the memory cell.

(Semiconductor Device)

A semiconductor device comprises an interlayer insulating layer which is formed on the under electrode, an impurity diffusion layer which is embedded into a pore which passes through the interlayer insulating layer, an upper electrode which is formed on the interlayer insulating layer, and an electric field application portion that applies an electric field to the impurity diffusion layer, wherein the electric field application portion that applies the electric field to the impurity diffusion layer, at least a portion or the whole of the impurity diffusion layer is depleted, and so may control an effective value of a current that passes through the impurity diffusion layer when the current passes between the under electrode and the upper electrode.

According to the semiconductor device, when the electric field application portion that applies the electric field to the impurity diffusion layer, at least a portion or a whole of the impurity diffusion layer is depleted, and can control arbitrarily the effective value of the current that passes through the impurity diffusion layer (in other words, a cross-section of the current path formed in the impurity diffusion layer) when the current passes between the under electrode and the upper electrode, by varying an effective diameter of the impurity diffusion layer which is embedded into the pore. Moreover, according to the semiconductor device, if the impurity diffusion layer is completely depleted, the current that passes through the impurity diffusion layer can be shut off.

The semiconductor device can be widely applied in devices other than the abovementioned phase change nonvolatile memory. For example, instead of the phase change recording layer 15 of the nonvolatile memory device 10, a resistance change type nonvolatile memory (hereinbelow referred to as a RRAM: resistance random access memory) can be constituted by arranging a resistance change layer between the impurity diffusion layer 14 and the upper electrode 16.

As set forth, the resistance change layer is composed of materials that changes the resistance when the current passes between the under electrode 11 and the upper electrode 16, and maintains the changed resistance. For specific examples of such materials, perovskite type metal oxides such as $Pr_{0.7}Ca_{0.3}MnO_3$ (PCMO), $SrTiO_3$ doped with Nb (Nb:STO) and the like or binary metal oxides such as $TiO_2$, NiO and the like are mentionable.

In this constitution, since when the current passes between the under electrode 11 and the upper electrode 16 until the resistance change layer changes the resistance, the changed resistance of the resistance change layer is maintained after the current passes. The data can be memorized by using the resistance change of the resistance change layer.

Furthermore, in the case of the RRAM likewise the case of the PRAM, if the electric field applies to the impurity diffusion layer 14 via the side gate insulating layer 25 with controlling the voltage that applied to the side gate electrode 24, it is possible to control arbitrary the effective value of the current that passes through the impurity diffusion layer 14.

Therefore, in this case, if the effective diameter +of the impurity diffusion layer 14 is controlled, the effective diameter that induces the resistance change in the resistance change layer can be arbitrary set. Therefore, it is possible to attempt low power consumption together with the large scale integration (making the large scale capacity) of the RRAM. Especially in the present invention, as shown in FIG. 25, FIG. 26A and FIG. 26B, it is possible to give a switch function to each memory cell without the use of a transistor which is provided on the semiconductor substrate. Therefore, if the present invention is applied to the RRAM, the integration degree can be easily enhanced.

Alternately, instead of the phase change recording layer 15 of the nonvolatile memory device 10, a one time programmable (OTP) type nonvolatile memory that can be written only once can be constituted by arranging an insulating thin layer which is contained between the impurity diffusion layer 14 and the upper electrode 16.

As set forth, in the OTP type nonvolatile memory, if the current that breaks down the insulating thin layer passes between the under electrode 11 and the upper electrode 16, the insulative state between the under electrode 11 and the upper electrode 16 by the insulating thin layer switches to the conductive state between the under electrode 11 and the upper electrode 16. Therefore, it is possible to write the data only once by the break down. The silicon oxide and the like whose layer thickness is appropriately controlled are employed as the insulating thin layer.

Furthermore, in the case of the OTP type nonvolatile memory likewise the case of the PRAM, if the electric field applies to the impurity diffusion layer 14 via the side gate insulating layer 25 while controlling the voltage that is applied to the side gate electrode 24, it is possible to arbitrarily control the effective value of the current that passes through the impurity diffusion layer 14 while controlling the effective diameter of the impurity diffusion layer 14 which is embedded into the pore 13.

Therefore, in this case, if the effective diameter φ of the impurity diffusion layer 14 is controlled, the effective diameter that induces the break down of the insulating thin layer can be arbitrarily set. Therefore, it is possible to attempt low power consumption together with the large scale integration (making the large scale capacity) of the OTP type nonvolatile memory. Especially in the present invention, as shown in FIG. 25, FIG. 26A and FIG. 26B, it is possible to give the switch function for each memory cell without use of the transistor which is provided on the semiconductor substrate. Therefore, if the present invention is applied to the OTP type nonvolatile memory, the integration degree can be easily enhanced.

As described above, according to the PRAM of the present invention, the electric field application portion applies the electric field to at least a portion of the impurity diffusion layer to be depleted and so the effective diameter of the impurity diffusion layer which is embedded into the pore becomes smaller than the pore diameter, wherein the current is applied between the under electrode and the upper electrode so the effective diameter of the heat spot to change the phase state of the phase change recording layer can become smaller than the pore diameter.

Therefore, according to the PRAM, the heat spot to the phase change recording layer decreases independently of the abovementioned process limit, thereby, the current path is concentrated so it is possible to attempt a decrease of the Ireset. Since the impurity diffusion layer is composed of materials having a lower thermal conductivity than the heat plug which is composed of metals having a high thermal conductivity, it is possible to heat (make the phase change) the phase change recording layer effectively through the smaller Ireset by decreasing the heat-sink effect. Therefore, according to the present invention, it is possible to attempt lowering power consumption together with large scale integration (making a large scale capacity) of the PRAM.

Furthermore, according to the semiconductor device of the present invention, the electric field application portion applies the electric field to at least a portion or the whole of the impurity diffusion layer to be depleted and so it is possible to arbitrarily control the effective value of the current that passes through the impurity diffusion layer by controlling the effective diameter of the impurity diffusion layer which is embedded into the pore. Moreover, according to the semiconductor device, it is possible to shut off the current that passes through the impurity diffusion layer by completely depleting the impurity diffusion layer.

In addition, the semiconductor device of the present invention may be provided with the resistance change layer between the impurity diffusion layer and the upper electrode, and, when the current is applied between the under electrode and the upper electrode until the resistance change layer changes the resistance, the changed resistance of the resistance change layer is maintained after the current passes. In this case, it is possible to constitute the RRAM.

Furthermore, the semiconductor device of the present invention may be provided with the insulating thin layer which is contained between the impurity diffusion layer and the upper electrode, and, if the current that breaks down the insulating thin layer is applied between the under electrode and the upper electrode, the insulative state between the under electrode and the upper electrode by the insulating thin layer switches to the conductive state between the under electrode 11 and the upper electrode 16. In this case, it is possible to constitute the OTP type nonvolatile memory.

Although the invention has been described above in connection with several preferred embodiments thereof, it will be appreciated by those skilled in the art that those embodiments are provided solely for illustrating the invention, and should not be relied upon to construe the appended claims in a limiting sense.

What is claimed is:
1. A phase change random access memory comprising:
   an under electrode;
   a first interlayer insulating layer which is formed on said under electrode;
   an impurity diffusion layer which is embedded into a first pore passing through said first interlayer insulating layer;
   a phase change recording layer which is formed on said first interlayer insulating layer;

an upper electrode which is formed on said phase change recording layer; and an electric field application portion that applies an electric field to said impurity diffusion layer so as to deplete at least a portion of said impurity diffusion layer and decrease an effective diameter of said impurity diffusion layer, wherein an effective diameter of a heat spot that changes a phase state of said phase change recording layer becomes smaller than the diameter of said first pore by applying a current between said under electrode and said upper electrode.

2. The phase change random access memory according to the claim 1 wherein, said electric field application portion further comprises:

a side gate electrode which is located on an inner wall of said first pore; and a side gate insulating layer which is located between said side gate electrode and said impurity diffusion layer.

3. The phase change random access memory according to the claim 2 wherein, said side gate electrode is provided on a partial or entire surface of said inner wall of said first pore.

4. The phase change random access memory according to claim 3 wherein, said side gate electrode is provided and elongated along the depth direction on said inner wall of said first pore.

5. The phase change random access memory according to claim 1, further comprising:

a second interlayer insulating layer which is provided between said first interlayer insulating layer and said phase change recording layer; and a second pore which is provided on said second interlayer insulating layer at a position above said first pore, said second pore being embedded with a portion of said phase change recording layer, a diameter of said second pore being smaller than that of said first pore.

6. The phase change random access memory according to claim 1, wherein a portion of said phase change recording layer is embedded into said first pore.

7. The phase change random access memory according to claim 1, wherein a sidewall layer is provided on said inner wall of said first pore.

8. A semiconductor device comprising:

an under electrode;

an interlayer insulating layer which is formed on said under electrode;

an impurity diffusion layer which is embedded into a pore passing through said interlayer insulating layer;

an upper electrode which is formed on said interlayer insulating layer; and an electric field application portion that applies an electric field to said impurity diffusion layer so as to deplete at least a portion or the whole of said impurity diffusion layer, and to change an effective value of a current that passes through said impurity diffusion layer when a current is applied between said under electrode and said upper electrode.

9. The semiconductor device according to claim 8, further comprising:

a resistance change layer which is provided between said impurity diffusion layer and said upper electrode, wherein said current is applied between said under electrode and said upper electrode until an electrical resistance of said resistance change layer changes so as to maintain the changed electrical resistance of said resistance change layer after said current is ceased.

10. The semiconductor device according to claim 8, further comprising:

an insulating thin layer which is provided between said impurity diffusion layer and said upper electrode, wherein a break down current is applied between said under electrode and said upper electrode so that an insulative state between said impurity diffusion layer and said upper electrode caused by said insulating thin layer switches to a conductive state.

* * * * *